US006215061B1

(12) United States Patent
Kariya

(10) Patent No.: US 6,215,061 B1
(45) Date of Patent: Apr. 10, 2001

(54) PHOTOCONDUCTIVE THIN FILM, AND PHOTOVOLTAIC DEVICE MAKING USE OF THE SAME

(75) Inventor: Toshimitsu Kariya, Kyoto (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/250,246

(22) Filed: Feb. 16, 1999

(30) Foreign Application Priority Data

Feb. 17, 1998 (JP) .................................................. 10-033454

(51) Int. Cl.$^7$ ...................................................... H01L 31/00
(52) U.S. Cl. ............................................. 136/256; 136/258
(58) Field of Search ..................................... 136/258, 256

(56) References Cited

U.S. PATENT DOCUMENTS 5,421,909 * 6/1995 Ishikawa et al. ..................... 136/256

FOREIGN PATENT DOCUMENTS

| 7-94766 | 4/1995 | (JP) . |
| 8-116080 | 5/1996 | (JP) . |

OTHER PUBLICATIONS

M. Vanecek, et al. "Optical Properties of Microcrystalline Materials" Journal of Non–Crystalline Solids, 227–230 pp. 967–972 (1998).

J. Meier, et al. "On the Way Towards High Efficiency Thin Film Silicon Solar Cells By The "Micromorph" Concept", Mat. Res. Soc. Symp. Proc. vol. 420, pp. 3–14 (1996).

Russell E. Hollingsworth, et al. Deposition of Polycrystalline Silicon Thin Films By Plasma Enhanced CVD, Mat. Res. Soc. Symp. vol. 283, pp. 659–664, (1993).

M. Tzolov, "Optical and Transport Studies on Thin Microcrystalline Silicon Films Preapared by Very High Frequency Glow Discharge for Solar Cell Applications", J. Appl. Phys., vol. 81, No. 11, pp. 7376–7385, (1997).

Krankenhagen, et al., "Determination . . . by CPM"; Solid State Phen., 47–48 (1996) 607–612.

Yamamto, et al.; "Optical . . . Substrate"; Jpm. J. Appl. Phys., 36 (1997) L569–L572.

S.C. De, et al.; "Change . . . Thickness"; Thin Solid Films, 167, (1988) 121–127.

* cited by examiner

*Primary Examiner*—Mark Chapman
(74) *Attorney, Agent, or Firm*—Fitzpatrick, Cella, Harper & Scinto

(57) ABSTRACT

A photoconductive thin film formed on a substrate and having at least hydrogen and crystal grains of silicon, which film has an Urbach energy Eu of 60 meV or below as measured by the constant photocurrent method. This film provides a photoconductive thin film free of light degradation and having superior photoconductivity, and provides a photovoltaic device having superior temperature characteristics and long-term stability.

114 Claims, 7 Drawing Sheets

LIGHT

PHOTOCONDUCTIVE THIN FILM, AND PHOTOVOLTAIC DEVICE MAKING USE OF THE SAME

BACKGROUND OF THE INVENTION

1. Field of the Invention

This invention relates to a photoconductive thin film formed on a substrate and containing hydrogen and crystal grains of silicon, which is called microcrystalline silicon, and a photovoltaic device such as a solar cell and a photosensor, making use of the photoconductive thin film.

2. Related Background Art

In recent years, there is a trend toward installation of solar cells on the roofs of houses so that they are connected to general electric power systems to cover the demand for electric power in summer. However, the cost for electricity generation by solar cells is still so high that solar cells have not spread on a large scale.

For making the solar cells low-cost, those employing amorphous silicon thin films in photovoltaic layers are considered advantageous, but have problems that they have a lower photoelectric conversion efficiency (hereinafter often "conversion efficiency") than crystal type solar cells and the conversion efficiency decreases during irradiation by light (hereinafter often "light degradation". Accordingly, almost all publication of researches on solar cells making use of amorphous silicon thin films (hereinafter often "amorphous solar cells") concerns with two points, "how high conversion efficiency be achieved" and "how light degradation be made less occur".

Researches concerning microcrystalline silicon containing hydrogen ($\mu$c-Si:H) also are almost all held by those aiming at its application to thin-film transistors and solar cells. In particular, a large number of researches are made on its application as doping layers of solar cells on their light-incident sides, making the most of the features that it has a small absorption coefficient at short wavelength and that it can enjoy a small activation energy. For example, Japanese Patent Application Laid-Open No. 8-116080 (hereinafter "Publication 1") discloses an attempt to enhance open-circuit voltage by using the $\mu$c-Si:H in p-type layers of a solar cell in which amorphous silicon thin films are used in i-type layers.

Making the most of the feature that it has a large absorption coefficient at long wavelength, researches are also made energetically on its use in i-type layers and photovoltaic layers of solar cells. For example, Solid-State Phenomena Vol. 47–78 (1996), pp.607–612, "Determination of Subgap Absorption in $\mu$c-Si:H Films by CPM", R. Krankenhagen, et al. (hereinafter "Publication 2") reports an absorption coefficient of $\mu$c-Si:H that is measured by the constant photocurrent method (CPM). According to this report, Urbach energy Eu is calculated to be about 120 meV.

Thin Solid Films Vol. 167 (1988), pp.121–127, "Change in the Properties of Glow-Discharge-Deposited Microcrystalline Silicon Films with Thickness", S. C. De, Awati and A. K. Barua (hereinafter "Publication 3") also reports that the properties of microcrystalline silicon thin films produced by plasma CVD change depending on layer thickness.

With an increase in layer thickness, hydrogen content decreases from 47% to up to 6.3%. The value of C1/C2 described later is estimated to be about 2 at a layer thickness of 250 nm or larger. It is also reported that dark conductivity (ad) rises from $1 \times 10^{-10}$ up to $9 \times 10^{-3}$ (1/$\Omega$·cm) with an increase in layer thickness. This is presumed to be due to the movement of Fermi level to the vicinity of an energy band end, which has made the activation energy small. Such movement of Fermi level is considered due to the presence of many defect levels (tail state) in the energy band.

More recently, a solar cell is reported which is a single cell comprising an i-type layer formed of $\mu$c-Si:H has a high conversion efficiency and may cause less light degradation. This solar cell is spotlighted as a substitute for solar cells whose i-type layers are formed of a-SiGe:H. Such a cell can be free from the light degradation that is peculiar to amorphous silicon thin films such as a-SiGe:H film, and also does not require to use any expensive material gases such as germanium gas ($GeH_4$).

This $\mu$c-Si:H thin film has not so large an absorption coefficient as the a-SiGe:H thin film, but has a possibility of attaining a short-circuit photocurrent (Jsc) comparable to the a-SiGe:H single cell when the i-type layer is formed in a layer thickness of 3 $\mu$m or larger. As an example of reports on it, MRS Symposium Proceeding Vol. 420, Amorphous Silicon Technology 1996, pp.3–13, "On the Way Toward High Efficiency Thin-Film Silicon Solar Cells by the Micromorph Concept", J. Meier et al. (hereinafter "Publication 4") reports a solar cell whose i-type layer is formed of microcrystalline silicon.

This solar cell is a solar cell produced by VHF plasma CVD making use of a frequency of 110 MHz, and has achieved a conversion efficiency of 7.7% in a single cell having one p-i-n junction (structure). In addition, this single cell has a great advantage that it is almost free from light degradation. Moreover, an additional p-i-n junction having an amorphous silicon thin film as its i-type layer is superposed on it to produce a stacked cell which has achieved a conversion efficiency of 13.1%.

However, it still has a high rate of light degradation, which does not differ from those of conventional amorphous silicon types. Then, it is also reported that, in the results of infrared (IR) spectroscopy, Si-H bonds are little present in the $\mu$c-Si:H thin film. Although no numerical values are reported, the slope of tail state (Urbach energy Eu) estimated from CPM absorption coefficient curves is about 66 meV.

Japan Journal of Applied Physics Vol. 36 (1997), pp.L569–L572, Part 2, No. 5A, "Optical Confinement Effect for below 5 $\mu$m Thick Film Poly-Si Solar Cell on Glass Substrate", Kenji Ymamamoto et al., Kaneka Corporation (hereinafter "Publication 5") also reports a single cell having a p-i-n junction formed of poly-Si and $\mu$c-Si which has achieved a conversion efficiency of 9.8%.

The i-type layer of this cell has a layer thickness of 3.5 $\mu$m, which is small for a poly-Si single cell, but has a fairly high short-circuit photocurrent (Jsc) of 26 mA/cm$^2$. Moreover, an additional p-i-n junction having an amorphous silicon thin film as its i-type layer is superposed on it to produce a stacked cell which has achieved a conversion efficiency of 12.8%.

Japanese Patent Application Laid-Open No. 7-94766 (hereinafter "Publication 6") also reports a solar cell constituted of SiN/p$^+$ poly-Si/p poly-Si/n$^+$ poly-Si/Al on a glass substrate, having achieved a conversion efficiency of as high as 10.1% at maximum. The solar cell reported in this patent publication has a feature that the p$^+$ poly-Si has orientation of (100)- (111)- and (110)- planes. However, its thickness for forming a junction is fairly as large as 10 $\mu$m, and film-forming temperature and annealing temperature are also fairly as high as 500° C. to 700° C. Because of such high film-forming temperature and annealing temperature, the hydrogen content in the film is presumed to be less than 1%.

Now, the above prior art has the following problems.

In Publication 1, the i-type layer is an amorphous silicon thin film (a-Si:H, a-SiGe:H or a-SiC:H), and hence the light degradation is unavoidable.

In Publication 2, the Urbach energy is as large as about 120 meV, and hence defect levels are considered present in a large number, thus such a film is by no means usable in photovoltaic devices.

In Publication 3, too, defect levels are considered present in a large number, and such a film is by no means usable in photovoltaic devices.

In Publication 4, the film has few Si—H bonds. Also, its Urbach energy is estimated to be about 66 meV, and the cell has a little low conversion efficiency of 7.7%.

In Publication 5, the cell has a high conversion efficiency of 9.8%, but the poly-Si:H thin film requires to have a layer thickness of about 3.5 μm. This is industrially disadvantageous compared with amorphous silicon thin films. Also, since the thin film is formed at a temperature of 550° C. at maximum, hydrogen is considered to be little contained. Moreover, because of a high temperature process, the substrate used is necessarily limited to glass.

In Publication 6, too, the cell has a high conversion efficiency of 10.1%, but the thickness for forming a junction must be as large as 10 μm. Similarly, since the thin film is formed at a temperature of 550 to 700° C., hydrogen is considered to be little contained. Also, because of a high temperature process, there has been the problem that the substrate used is necessarily limited to glass.

SUMMARY OF THE INVENTION

Objects of the present invention are to provide a non-single-crystal silicon thin film that may cause no light degradation, has a superior photoconductivity and is suited for photovoltaic devices such as solar cells and photosensors, and to provide a photovoltaic device that has superior temperature characteristics and long-term stability and is suited for its application to solar cells.

The present invention is a photoconductive thin film formed on a substrate and having at least hydrogen and crystal grains of silicon, wherein;

the crystal grains of silicon have columnar shape, and the photoconductive thin film has an Urbach energy Eu of 60 meV or below as measured by the constant photocurrent method.

The present invention is also a photovoltaic device comprising a substrate and superposed successively thereon at least a back reflective layer, a photovoltaic p-i-n junction layer and a transparent conductive layer, wherein;

an i-type layer constituting the p-i-n junction layer comprises a photoconductive thin film having at least hydrogen and columnar crystal grains of silicon, and the photoconductive thin film has an Urbach energy Eu of 60 meV or below as measured by the constant photocurrent method. (The "p-i-n junction layer" is herein meant to be a layer having p-i-n junction, i.e., a layer having regions of transition between p-type, i-type and n-type layers; the like applies also to the following $p^+-p^--n^+$ junction layer and $p^+-n^--n^+$ junction layer.)

The present invention is still also a photovoltaic device comprising a substrate and superposed successively thereon at least a back reflective layer, a photovoltaic $p^+-n^--n^+$ junction layer and a transparent conductive layer, wherein;

a $p^-$-type layer constituting the $p^+-n^--n^+$ junction layer comprises a photoconductive thin film having at least hydrogen and columnar crystal grains of silicon, and the photoconductive thin film has an Urbach energy Eu of 60 meV or below as measured by the constant photocurrent method.

The present invention is still also a photovoltaic device comprising a substrate and superposed successively thereon at least a back reflective layer, a photovoltaic $p^+-n^--n^+$ junction layer and a transparent conductive layer, wherein;

an $n^-$-type layer constituting the $p^+-n^--n^+$ junction layer comprises a photoconductive thin film having at least hydrogen and columnar crystal grains of silicon, and the photoconductive thin film has an Urbach energy Eu of 60 meV or below as measured by the constant photocurrent method.

In the photoconductive thin film, hydrogen content C1 atom % ascribable to Si—H bonds and hydrogen content C2 atom % ascribable to Si—$H_2$ bonds may preferably have a relation of $C1/C2 \geq 0.8$ and $3 \leq C1+C2 \leq 8$ atom %.

The present invention is still also a photoconductive thin film formed on a substrate and having at least hydrogen and crystal grains of silicon, wherein;

the photoconductive thin film has an Urbach energy Eu of 60 meV or below as measured by the constant photocurrent method, and, in the photoconductive thin film, hydrogen content C1 atom % ascribable to Si—H bonds and hydrogen content C2 atom % ascribable to Si—$H_2$ bonds have a relation of $C1/C2 \geq 0.8$ and $3 \leq C1+C2 \leq 8$ atom %.

The present invention is still also a photovoltaic device comprising a substrate and superposed successively thereon at least a back reflective layer, a photovoltaic p-i-n junction layer and a transparent conductive layer, wherein;

an i-type layer constituting the p-i-n junction layer comprises a photoconductive thin film having at least hydrogen and crystal grains of silicon, and the photoconductive thin film has an Urbach energy Eu of 60 meV or below as measured by the constant photocurrent method, and hydrogen content C1 atom % ascribable to Si—H bonds and hydrogen content C2 atom % ascribable to Si—$H_2$ bonds have a relation of $C1/C2 \geq 0.8$ and $3 \leq C1+C2 \leq 8$ atom %.

The present invention is still also a photovoltaic device comprising a substrate and superposed successively thereon at least a back reflective layer, a photovoltaic $p^+-n^--n^+$ junction layer and a transparent conductive layer, wherein;

a $p^-$-type layer constituting the $p^+-n^--n^+$ junction layer comprises a photoconductive thin film having at least hydrogen and crystal grains of silicon, and the photoconductive thin film has an Urbach energy Eu of 60 meV or below as measured by the constant photocurrent method, and hydrogen content C1 atom % ascribable to Si—H bonds and hydrogen content C2 atom % ascribable to Si—$H_2$ bonds have a relation of $C1/C2 \geq 0.8$ and $3 \leq C1+C2 \leq 8$ atom %.

The present invention is still also a photovoltaic device comprising a substrate and superposed successively thereon at least a back reflective layer, a photovoltaic $p^+-n^--n^+$ junction layer and a transparent conductive layer, wherein;

an $n^-$-type layer constituting the $p^+-n^--n^+$ junction layer comprises a photoconductive thin film having at least hydrogen and crystal grains of silicon, and the photoconductive thin film has an Urbach energy Eu of 60 meV or below as measured by the constant photocurrent method, and hydrogen content C1 atom % ascribable to Si—H bonds and hydrogen content C2 atom % ascribable to Si—$H_2$ bonds have a relation of $C1/C2 \geq 0.8$ and $3 \leq C1+C2 \leq 8$ atom %.

The above crystal grains of silicon may preferably have columnar shape.

The Urbach energy Eu may preferably be an energy at 0.9 eV to 1.1 eV in the vicinity of 1.0 eV of photon energy.

The columnar crystal grains may preferably have an angle of not larger than 8° which is formed by the longer direction of the grain and the normal direction of the substrate surface.

Crystal grains of silicon may preferably have an average grain diameter of from 20 nm to 200 nm as calculated from the (220)-peak of silicon among X-ray diffraction peaks of the photoconductive thin film.

The photoconductive thin film may preferably contain amorphous silicon, where the volume ratio R of the crystal grains of silicon with respect to the volume of the whole thin film is $R \geq 0.5$.

The hydrogen content C1 ascribable to Si—H bonds may preferably be from 2 atom % to 6 atom %.

The photoconductive thin film may preferably be formed by plasma CVD making use of electromagnetic waves with a frequency of from 50 MHz to 900 MHz, using silicon-containing gas and hydrogen gas and under conditions of a pressure of from 10 mTorr to 500 mTorr, a substrate-to-electrode distance of from 10 mm to 50 mm and a substrate temperature of from 200° C. to 600° C.

The i-type layer, p⁻-type layer or n⁻-type layer may preferably have a layer thickness of from 0.5 $\mu$m to 3 $\mu$m.

A high-doped layer underlying the i-type layer, p⁻-type layer or n⁻-type layer constituting the p-i-n junction layer, p⁺-n⁻-n⁺ junction layer or p⁺-n⁻-n⁺ junction layer may preferably be a non-single-crystal silicon thin film containing hydrogen and crystal grains of silicon.

An additional p-i-n junction layer A may preferably be provided between the p-i-n junction layer, p⁺-n⁻-n⁺ junction layer or p⁺-n⁻-n⁺ junction layer and the transparent conductive layer, and an i-type layer A constituting the p-i-n junction layer A may preferably be constituted of an amorphous silicon thin film containing hydrogen or an amorphous silicon carbide thin film containing hydrogen.

The i-type layer A may preferably have a layer thickness of from 0.1 $\mu$m to 0.4 $\mu$m.

The back reflective layer may preferably be constituted chiefly of an element comprising silver, copper, copper-magnesium or aluminum.

The transparent conductive layer may preferably be formed of ITO (indium-tin oxide) formed by sputtering.

The photovoltaic device may preferably have, between the p-i-n junction layer, p⁺-n⁻-n⁺ junction layer or p⁺-n⁻-n⁺ junction layer and the back reflective layer, a back transparent conductive layer formed of ZnO or $SnO_2$.

At least one layer of the transparent conductive layer, the back transparent conductive layer and the back reflective layer may preferably have a textured structure having a surface roughness Ra of from 0.1 $\mu$m to 5 $\mu$m.

DESCRIPTION OF THE PREFERRED EMBODIMENTS

Figure 1:
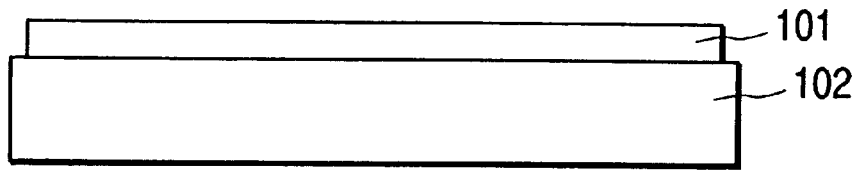
FIG. 1 is a cross-sectional view showing an example of how the photoconductive thin film of the present invention is formed.

The photoconductive thin film of the present invention and the photovoltaic device making use of it will be described below along its constitution and operation.

1) Usually, microcrystalline silicon ($\mu$c-Si) thin films have very many tail states and mid gap states present therein, and have a small photoconductivity. However, the photoconductive thin film ($\mu$c-Si:H thin film) of the present invention has an Urbach energy Eu of 60 meV or below as measured by the constant photocurrent method (CPM). Hence, its state density decreases abruptly, and can have a very few defect levels not dependent on photoconductivity. Thus, the photovoltaic device can be improved in short-circuit photocurrent, open-circuit voltage and fill factor. The Urbach energy Eu may preferably be an energy at 0.9 eV to 1.1 eV in the vicinity of 1.0 eV of photon energy.

Since the state density of urbach tail has decreased abruptly, the $\mu$c-Si:H thin film of the present invention has an absorption coefficient of 100 (1/cm) or more in respect of light having an energy of 1.2 eV or above, and hence can have a very high sensitivity to light having a small energy. Accordingly, the photoconductive layer of the photovoltaic device can be formed in a small layer thickness. Also, the photovoltaic device having a small layer thickness can have a stronger internal electric field, and hence the movability of photo-carriers can be improved and the fill factor of the photovoltaic device can be improved.

2) Si—H bonds in the $\mu$c-Si:H thin film have the function to compensate dangling bonds of silicon atoms to improve photoconductivity. On the other hand, Si—$H_2$ bonds compensate dangling bonds but form defect levels in the band gap to damage photoconductivity greatly. Observation of infrared spectra of $\mu$c-Si:H thin films having little photoconductivity shows that there are only Si—$H_2$ bonds and few Si—H bonds in many cases. Considering that hydrogen is little present in the crystal grains of silicon, it is considered that "the surroundings (grain boundaries) of the grains tend to comprise Si—$H_2$ bonds".

However, the photoconductive thin film of the present invention has a few Si—$H_2$ bonds at the crystal grain boundaries and exhibits a high photoconductivity. On the other hand, the Si—H bonds are present at the crystal grain boundaries, and the levels of tail states at 0.9 eV to 1.1 eV in the vicinity of 1.0 eV of photon energy and mid gap states can be made fewer. Moreover, compared with those having no Si—H bonds at the crystal grain boundaries, the internal stress can be relaxed and hence the defect levels can be made fewer dramatically. Usually, the infrared spectra of μc-Si:H thin films show absorption at 2,000 (1/cm) which corresponds to the Si—H bonds, and absorption at 2,100 (1/cm), which corresponds to the Si—$H_2$ bonds. It has been found that the effect as stated above can be remarkable when hydrogen content C1 ascribable to Si—H bonds and hydrogen content C2 ascribable to Si—$H_2$ bonds have a relation of $C1/C2 \geq 0.8$.

In the present invention, the C1 and C2 may also preferably have a relation of $3 \leq C1+C2 \leq 8$ atom %. This is considered to make the silicon network structure very less sway due to any excess hydrogen bonds, and is considered to make the film have few weak bonds. Accordingly, the light degradation is considered to little occur.

3) The photoconductive thin film of the present invention is characterized in that it may preferably have columnar crystal grains and their longer direction may preferably be substantially perpendicular to the substrate surface. Stated specifically, the columnar crystal grains may preferably have an angle of not larger than 8° which is formed by the longer direction of the grain and the normal direction of the substrate surface. In such constitution, when photo-carriers are led to the direction perpendicular to the substrate, the photo-carriers move in the longer direction of the columnar crystals, and hence may hardly be affected by crystal grain boundaries, so that especially good photoconductivity can be attained.

Incidentally, what is meant by the columnar crystal grains embraces inverted-cone-shaped crystal grains and inverted-trapezoid-shaped crystal grains. Cone-shaped grains whose tips face the substrate may also be desirable. In such constitution, when photo-carriers are led to the direction perpendicular to the substrate, the photo-carriers move in the axial direction of the crystals, and hence may hardly be affected by crystal grain boundaries, so that especially good photoconductivity can be attained. Such structure makes the thin-film surface have a shape of uneven structure, and can improve the effect of confining light.

4) Crystal grains of silicon may preferably have an average grain diameter of from 20 nm to 200 nm as calculated from the (220)-peak of silicon among X-ray diffraction peaks of the photoconductive thin film of the present invention. Within that range, the film has a very large absorption coefficient in respect of light having a photon energy of from 1.2 eV to 1.9 eV, which is larger than that of crystalline silicon.

If the crystal grains have an average grain diameter smaller than 20 nm, the crystal grains are presumed to have so small a size as to be affected by grain boundaries to cause a lowering of photoconductivity. Such grains are also presumed to stand closely amorphous, and hence may have a very small absorption coefficient to cause a lowering of photoconductivity.

If on the other hand the crystal grains have an average grain diameter larger than 200 nm, such grains are presumed to be less affected by grain boundaries but stand closely single crystal, and hence may still have a small absorption coefficient.

The photoconductive thin film of the present invention has so large a light absorption coefficient that the photoconductive layer of the photovoltaic device can be formed in a small layer thickness. Also, the photovoltaic device having a small photoconductive layer thickness can have a stronger internal electric field, and hence the movability of photo-carriers can be improved and the fill factor of the photovoltaic device can be improved. Moreover, in the case where the crystal grains have an average grain diameter of from 20 nm to 200 nm, a thin film having a superior flexibility can be obtained.

5) The photoconductive thin film of the present invention may preferably contain amorphous silicon, where the volume ratio R of crystal grains of silicon with respect to the volume of the whole thin film is $R \geq 0.5$ (R=volume of crystal grain region/volume of the whole thin film). In such a thin film, crystal grains of silicon can be covered with good-quality amorphous silicon, thus it may have only a very few interface levels.

If the volume ratio R is less than 0.5, the region held by amorphous silicon is so large as to make the absorption coefficient at long wavelength (800 nm to 1,100 nm) very small, resulting in a poor photoconductivity and a low short-circuit photocurrent. Also, the light degradation may greatly occur, undesirably.

6) In the photoconductive thin film of the present invention, hydrogen content C1 ascribable to Si—H bonds in the film, may preferably be from 2 atom % to 6 atom %. In such a thin film, correlating with the volume ratio R, the hydrogen content in the amorphous silicon around the crystal grains of silicon is presumed to be about 10 to 20 atom %.

Hence, the tail states and mid gap states in the amorphous silicon between the crystal grains are as few as those of usual amorphous silicon, and the photo-carriers are hardly trapped there, having a sufficiently high movability. Although the reason is unclear, the light degradation little occurs because of the presence of such amorphous silicon regions in a network fashion.

To obtain the photoconductive thin film of the present invention, the film may preferably be formed by plasma CVD (chemical vapor deposition) making use of electromagnetic waves with a frequency of from 50 MHz to 900 MHz, using silicon-containing gas and hydrogen gas and at a pressure of from 10 mTorr to 500 mTorr and a substrate temperature of from 200° C. to 600° C. As the silicon-containing gas, silanes such as monosilane, disilane and trisilane may preferably be used.

In particular, the hydrogen gas may preferably be introduced in at least 10-fold amount based on the flow rate of the silicon-containing gas.

The electromagnetic waves may preferably have a frequency of from 100 MHz to 500 MHz.

Electrodes may preferably be of a parallel plate type, parallel to the substrate, and be set at a substrate-to-electrode distance of from 10 mm to 50 mm.

The pressure may preferably be from 100 mTorr to 300 mTorr, and the substrate temperature may preferably be from 200° C. to 450° C.

In order to make the thin film have a good quality, the electromagnetic waves may preferably be applied at a low power so as to make deposition rate low. In an industrial scale, however, the film may preferably be formed while flowing material gases in a large quantity and at a high power and a high formation rate (making the value of power/material gas flow rate small). Under such thin film forming conditions, the film may undergo a very little damage by electrons and ions, and hence it is considered that films with a few defect levels and a high photoconductivity can be obtained.

In order to more improve crystallinity, a high-frequency bias (frequency: 3 to 30 MHz) with a low-power or a DC bias of about −10 V may be applied in plasma. Such a manner of film formation enables formation of a photoconductive thin film having a large area and a high uniformity.

A roll-to-roll process may also be used so that the production rate can be improved dramatically. This enables achievement of low-cost production of photovoltaic devices having the photoconductive thin film of the present invention. In the roll-to-roll process, the substrate is transported continuously, and hence the film can be made uniformly and in large area.

7) The photovoltaic device of the present invention comprises, according to a first embodiment, a substrate and provided successively thereon at least a back reflective layer, a photovoltaic p-i-n junction layer and a transparent conductive layer, wherein an i-type layer constituting the p-i-n junction layer is the photoconductive thin film ($\mu$c-Si:H thin film) of the present invention.

This i-type layer has a very few mid gap states and tail states and has a high photoconductivity, and hence has a high short-circuit photocurrent, a high open-circuit voltage and a high fill factor, promising a high photoelectric conversion efficiency. It also has a very few weak bonds, and hence may cause little light degradation. Moreover, the photoconductive thin film of the present invention has a high flexibility, and hence, when formed on a substrate having a flexibility, the flexibility of the substrate is by no means damaged.

8) According to a second embodiment, the photovoltaic device of the present invention comprises a substrate and provided successively thereon at least a back reflective layer, a photovoltaic $p^+p^-n^+$ junction layer and a transparent conductive layer, wherein a $p^-$-type layer constituting the $p^+p^-n^+$ junction layer is the photoconductive thin film ($\mu$c-Si:H thin film) of the present invention.

This $p^-$-type layer has a very few mid gap states and tail states and has a high photoconductivity, and hence has a high short-circuit photocurrent, a high open-circuit voltage and a high fill factor, promising a high photoelectric conversion efficiency. It also has a very few weak bonds, and hence may cause little light degradation. Moreover, the photoconductive thin film of the present invention has a high flexibility, and hence, when formed on a substrate having a flexibility, the flexibility of the substrate is by no means damaged.

To form the $p^-$-type layer, a gas containing boron may be used in material gases. The boron in the $p^-$-type layer may preferably be in a content of from 10 to 1,000 ppm.

9) According to a third embodiment, the photovoltaic device of the present invention comprises a substrate and provided successively thereon at least a back reflective layer, a photovoltaic $p^+p^-n^+$ junction layer and a transparent conductive layer, wherein an $n^-$-type layer constituting the $p^+p^-n^+$ junction layer is the photoconductive thin film ($\mu$c-Si:H thin film) of the present invention.

This $n^-$-type layer has a very few mid gap states and tail states and has a high photoconductivity, and hence has a high short-circuit photocurrent, a high open-circuit voltage and a high fill factor, promising a high photoelectric conversion efficiency. It also has a very few weak bonds, and hence may cause little light degradation. Moreover, the photoconductive thin film of the present invention has a high flexibility, and hence, when formed on a substrate having a flexibility, the flexibility of the substrate is by no means damaged.

To form the $n^-$-type layer, a gas containing phosphorus may be used in material gases. The phosphorus in the $n^-$-type layer may preferably be in a content of from 10 to 1,000 ppm.

10) In the photovoltaic device of the present invention, among layers constituting the p-i-n junction layer, a high-doped layer (n-type layer or p-type layer) underlying the i-type layer, among layers constituting the $p^+p^-n^+$ junction layer, a high-doped layer (p-type layer or $n^+$-type layer) underlying the $p^-$-type layer, and, among layers constituting the $p^+p^-n^+$ junction layer, a high-doped layer ($p^-$-type layer or $n^+$-type layer) underlying the $n^-$-type layer may preferably be a non-single-crystal silicon thin film containing hydrogen and crystal grains of silicon.

These i-type layer, $p^-$-type layer and $n^-$-type layer may contain 1 to 1,000 ppm of at least one of carbon, oxygen, nitrogen, fluorine and chlorine. These elements are important as those for keeping the flexibility of the film.

Such constitution makes it possible to improve the crystallinity of the i-type layer constituting the p-i-n junction layer, the $p^-$-type layer constituting the $p^+p^-n^+$ junction layer and the $n^-$-type layer constituting the $p^+p^-n^+$ junction layer. Such means is effective when the i-type layer, $p^-$-type layer or $n^-$-type layer is formed at a high rate.

More specifically, in an industrial scale, it is cost-advantageous to form the i-type layer, $p^-$-type layer or $n^-$-type layer at a high rate as having a large layer thickness. However, formation of these layers at a higher rate generally tends to cause a lowering of their crystallinity.

In such an instance, the high-doped layer which is an underlying layer of the i-type layer, $p^-$-type layer or $n^-$-type layer may be constituted of the non-single-crystal silicon thin film having hydrogen and crystal grains of silicon, whereby the i-type layer, $p^-$-type layer or $n^-$-type layer, when formed, can be made to grow while maintaining the crystallinity of the underlying layer. In the region where crystal grains stand bare to the surface, it grows in a crystalline state, and, in the region where the amorphous regions stand bare to the surface, it grows in an amorphous state. Hence, the size of crystal grains in the underlying high-doped layer and the volume ratio of the crystal grain region are important.

In order to obtain the photoconductive thin film of the present invention at a high formation rate, the size of crystal grains in the high-doped layer may preferably be about 0.1 time to about 10 times the size of crystal grains in the photoconductive thin film of the present invention. The volume ratio may preferably be about 0.01 times to about 1 time the volume ratio of the photoconductive thin film of the present invention.

11) In the photovoltaic device of the present invention, the back reflective layer may preferably be constituted chiefly of an element comprising silver, copper, copper-magnesium or aluminum. Such a back reflective layer has a high reflectance and can improve short-circuit photocurrent of the photovoltaic device.

12) In the photovoltaic device of the present invention, its transparent conductive layer may preferably be formed of ITO (indium-tin oxide) by sputtering. An ITO film formed by sputtering has a high heat resistance, and can be free from changes in its resistance within the temperature range of from room temperature to 100° C. Accordingly, the photovoltaic device can be improved in heat resistance (within the range of from room temperature to 100° C.).

Irradiation of photovoltaic devices by strong light commonly causes a rise of temperature of the photovoltaic devices. For example, under the scorching sun in summer, the temperature of photovoltaic devices reaches as high as 60° C. In the case of transparent conductive layers having a low heat resistance, its resistivity increases with time and does not become restored if the temperature has dropped. Hence, the fill factor of photovoltaic devices lowers gradually. Since the lowering of fill factors leads to power loss, the heat resistance of the transparent conductive layer is important.

13) In the photovoltaic device of the present invention, an additional p-i-n junction layer A may preferably be provided between the p-i-n junction layer, $p^+p^--n^+$ junction layer or $p^+p^--n^+$ junction layer and the transparent conductive layer, and an i-type layer A constituting the p-i-n junction layer A may preferably be constituted of an amorphous silicon thin film containing hydrogen. This can make the photovoltaic device have a broader spectral sensitivity.

More specifically, the photoconductive thin film of the present invention is considered to have a band gap of about 1.0 eV. Irradiation by light (short wavelength light) having an energy higher than that results in a loss corresponding to the difference in energy. The i-type layer A formed of an amorphous silicon thin film containing hydrogen has a large band gap of 1.8 to 1.6 eV, and hence can have a small energy difference correspondingly, and may cause less power loss, so that a higher photoelectric conversion efficiency can be achieved. Also, the open-circuit voltage can be made higher and the short-circuit photocurrent smaller, and hence any power loss due to the resistance of circuits can be reduced.

Such a stacked photovoltaic device makes it possible to form the i-type layer, $p^-$-type layer or $n^-$-type layer in a smaller layer thickness and to improve the internal electric field of the the p-i-n junction layer, $p^+p^--n^+$ junction layer or $p^+p^--n^+$ junction layer, so that the fill factor can be improved. Also, a material having a large band gap may be used in the i-type layer A, whereby the photovoltaic device can be improved in temperature characteristics.

In general, photovoltaic devices making use of photoconductive thin films having a larger band gap seem to cause a smaller variation in solar cell performances which is caused by temperature. Since the photoconductive thin film of the present invention has a small band gap of 1.0 eV, the temperature characteristics of a single cell are at best on the level of those of photovoltaic devices making use of crystalline silicon. However, such temperature characteristics can be improved dramatically by superposing the additional p-i-n junction layer A making use of a material having a large band gap. More specifically, this can restrain the open-circuit voltage from lowering as a result of temperature rise, and also the photoelectric conversion efficiency from decreasing.

14) In the photovoltaic device of the present invention, the i-type layer A may preferably constituted of an amorphous silicon thin film containing hydrogen or an amorphous silicon carbide thin film containing hydrogen.

Since these materials contain hydrogen, they have a very few mid gap states and tail states, and can attain high short-circuit photocurrent, open-circuit voltage and fill factor.

The amorphous silicon thin film containing hydrogen has a band gap of from 1.7 eV to 1.9 eV, and the amorphous silicon carbide thin film has a band gap of from 1.8 eV to 2.1 eV. Hence, these are materials suited for the i-type layer A of the stacked photovoltaic device of the present invention.

In particular, in the case where the amorphous silicon carbide thin film having a large band gap is used, optimum operating voltage can be made higher and optimum operating electric current can be made lower, without causing a lowering of conversion efficiency of the photovoltaic device so much. Hence, when photovoltaic devices are connected in series to set up a module, module loss such as resistance loss and shadow loss can be reduced.

The amorphous silicon thin film has a larger band gap as it contains more hydrogen, but, if its hydrogen content exceeds 15 atom %, comes to have many weak bonds to cause a great deterioration by light undesirably. It may preferably have a hydrogen content of 15 atom % or less.

The amorphous silicon carbide thin film also has a larger band gap as it contains more hydrogen, and also has a larger band gap as it has a larger carbon content. However, since mid gap states and tail states increase with an increase in carbon content, it may preferably have a carbon content of from 5 to 30 atom %.

15) The photovoltaic device of the present invention may have, between the p-i-n junction layer, $p^+p^--n^+$ junction layer or $p^+p^--n^+$ junction layer and the back reflective layer, a back transparent conductive layer formed of ZnO or $SnO_2$.

This enables prevention of a short circuit of the photovoltaic device. The back transparent conductive layer has a resistivity of from $10^{-2}$ to $10^{-5}$ Ω·cm, and hence it can prevent the fill factor from greatly lowering because of a short circuit at minute regions. This resistivity is a value intermediate between the resistivity of metal and that of the i-type layer, $p^-$-type layer and $n^-$-type layer. This layer may have a thickness of from 1 μm to 5 μm so that the light can be confined effectively. More specifically, refractive indexes change abruptly at the interface between the transparent conductive layer and air and at the interface between the back transparent conductive layer and the back reflective layer, and also the product of layer thickness and refractive index is larger than wavelengths of light (1 μm at maximum). Hence, the light is confined effectively. Consequently, the short-circuit photocurrent is improved.

16) In the photovoltaic device of the present invention, at least one layer of the transparent conductive layer, the back transparent conductive layer and the back reflective layer may preferably have a textured structure having a surface roughness Ra of from 0.1 μm to 5 μm. With such structure, the light can be confined much more effectively. Consequently, the short-circuit photocurrent and optical sensitivity are improved. In addition, the light can be restrained from interfering since the path of light is curved. Hence, the device can be free from any uneven spectrum of optical sensitivity and have a flat sensitivity over a wide range, bringing about an improvement in sensitivity characteristics of photosensors.

17) In the photovoltaic device of the present invention, the i-type layer, $p^-$-type layer or $n^-$-type layer may preferably have a layer thickness of from 0.5 μm to 3 μm. Since the photoconductive thin film constituting the photovoltaic device of the present invention has a large absorption coefficient in respect of light having a photon energy of 1.2 eV or above, it can be formed in a smaller layer thickness than that of photovoltaic devices making use of conventional μc-Si:H thin films in i-type layers, $p^-$-type layers or $n^-$-type layers. This is desirable in view of both industrial application and cost. Also, such thin-film formation can make the fill factor higher. Moreover, the internal electric field can be made higher, and hence photo-carriers are restrained from their recombination to enable further prevention of light degradation.

18) In the photovoltaic device of the present invention, the i-type layer A may preferably have a layer thickness of from 0.1 μm to 0.4 μm. In photovoltaic devices making use of conventional amorphous silicon thin films in i-type layers, the layer thickness has been fairly as large as about 0.5 μm. Hence, their internal electric field has been so weak that the light degradation caused by the recombination of photo-carriers has not been ignorable. Since, however, the i-type layer A of the stacked photovoltaic device of the present invention may have a layer thickness of from 0.1 μm to 0.4 μm, its internal electric field is so strong that photo-carriers can be restrained from their recombination to make light degradation less occur.

FIG. 1 is a cross-sectional view showing an example of how the photoconductive thin film of the present invention is formed. In FIG. 1, reference numeral 102 denotes a substrate. A photoconductive thin film 101 is formed thereon.

Figure 2:
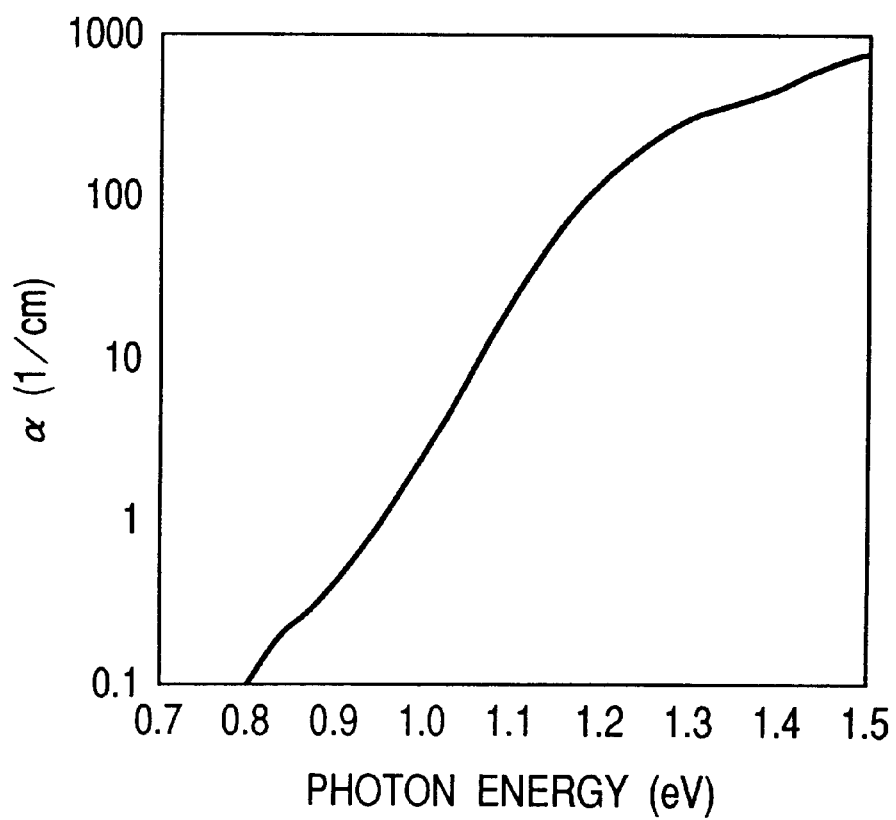
FIG. 2 illustrates the relationship between photon energy and absorption coefficient.

FIG. 2 shows an absorption coefficient spectrum measured by the constant photocurrent method (CPM) to determine the Urbach energy Eu of the photoconductive thin film of the present invention. In this sample, Urbach energy Eu at 0.9 eV to 1.1 eV in the vicinity of 1.0 eV of photon energy is calculated to be 48 meV. The absolute value of absorption coefficient is so made as to be in agreement with the value of 1.4 eV to 1.5 eV, based on absorption coefficient measured with a spectrophotometer.

Figure 3:
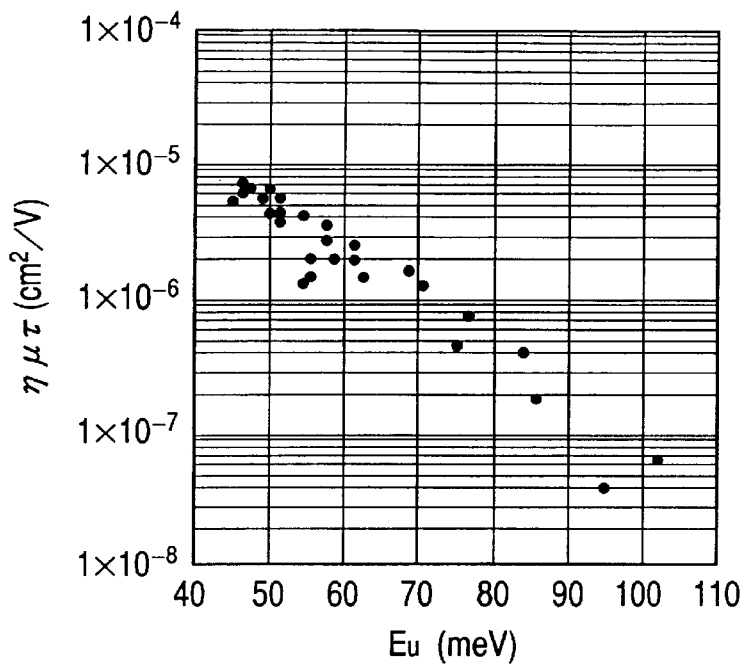
FIG. 3 illustrates the relationship between Urbach energy Eu and $\eta\mu\tau$ product.

FIG. 3 shows the relationship between Urbach energy Eu and $\eta\mu\tau$ product of a photoconductive thin film formed on a glass substrate. When the Urbach energy Eu becomes higher than 60 meV, the value of $\eta\mu\tau$ product becomes $10^{-6}$ cm$^2$/V or below, showing that the photoconductivity has lowered.

Accordingly, it can be defined from FIGS. 2 and 3 that a preferred range of the Urbach energy Eu measured by the constant photocurrent method (CPM) is 60 meV or below at 0.9 eV to 1.1 eV in the vicinity of 1.0 eV of photon energy.

Figure 4:
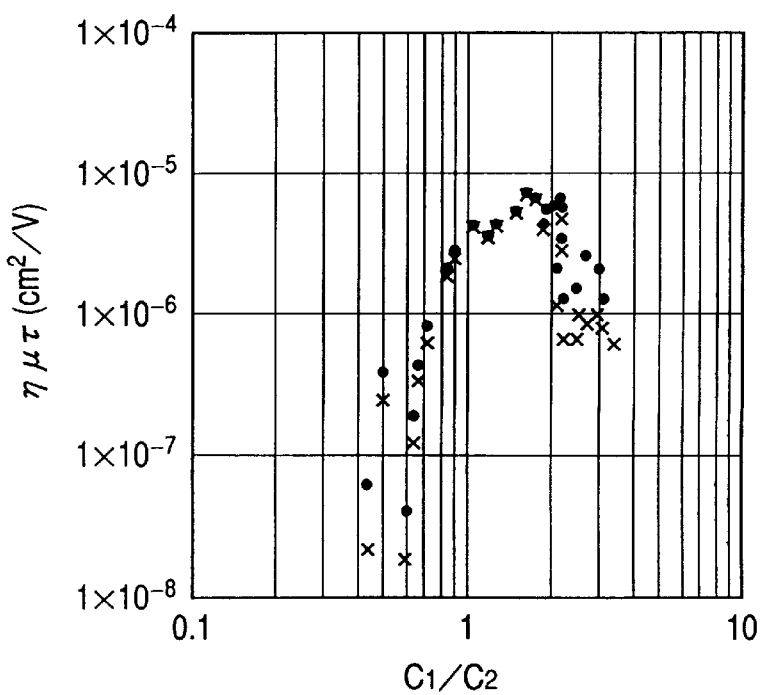
FIG. 4 illustrates the relationship between C1/C2 and $\eta\mu\tau$ product.

FIG. 4 shows the relationship between hydrogen content C1 ascribable to Si—H bonds, hydrogen content C2 ascribable to Si—H$_2$ bonds and photoconductivity $\eta\mu\tau$ product in the photoconductive thin film containing the present invention, formed on a silicon wafer. Solid black circles indicate those in as-depo state (a state after film formation and before irradiation by light), and marks x, those after 100-hour continuous irradiation by light of AM 1.5 (100 mW/cm$^2$).

As shown in FIG. 4, the C1/C2 and $\eta\mu\tau$ product have a positive correlation. In the region where the C1/C2 is 0.8 or more, the $\eta\mu\tau$ product is $10^{-6}$ cm$^2$/V or above, thus it is seen that the photoconductivity is good in that region. Also, after irradiation by light, too, the $\eta\mu\tau$ product little changes in the region where the C1/C2 is 0.8 or more, thus it is seen that light degradation little occurs. The Urbach energy Eu was also examined by CPM to find that Eu was 60 meV or below when the C1/C2 was 0.8 or more.

Figure 5:
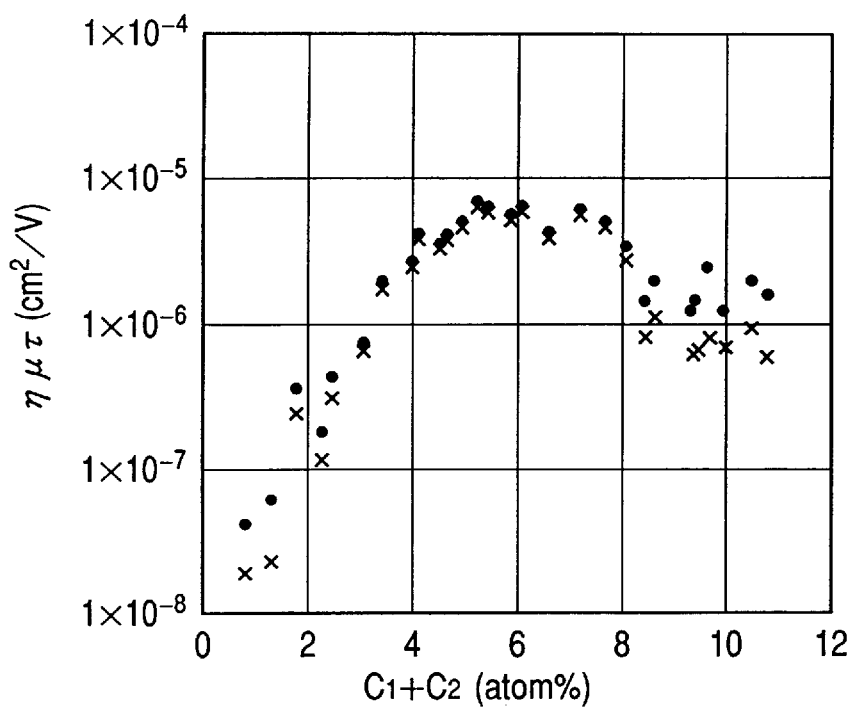
FIG. 5 illustrates the relationship between C1+C2 and $\eta\mu\tau$ product.

FIG. 5 shows the relationship between C1+C2 and photoconductivity $\eta\mu\tau$ product in the photoconductive thin film according to the present invention, formed on a silicon wafer. Solid black circles indicate those in as-depo state (a state after film formation and before irradiation by light), and marks x, those after 100-hour continuous irradiation by light of AM 1.5 (100 mW/cm$^2$).

As shown in FIG. 5, in the region where the C1+C2 is 3% or more, the $\eta\mu\tau$ product is substantially $10^{-6}$ cm$^2$/V or above, thus it is seen that the photoconductivity is good in that region. Also, after irradiation by light, the $\eta\mu\tau$ product is substantially $10^{-6}$ cm$^2$/V or above in the region where the C1+C2 is between 3% and 8%, showing little change before and after irradiation by light, thus it is seen that light degradation little occurs. The Urbach energy Eu was also examined by CPM to find that any Eu at 0.9 eV to 1.1 eV in the vicinity of 1.0 eV of photon energy was 60 meV or below in this region.

Accordingly, it can be defined from FIGS. 4 and 5 that a preferred relationship between the hydrogen content C1 atom % ascribable to Si—H bonds and the hydrogen content C2 atom % ascribable to Si—H$_2$ bonds is C1/C2≧0.8 and 3≦C1+C2≦8 atom %.

Figure 6:
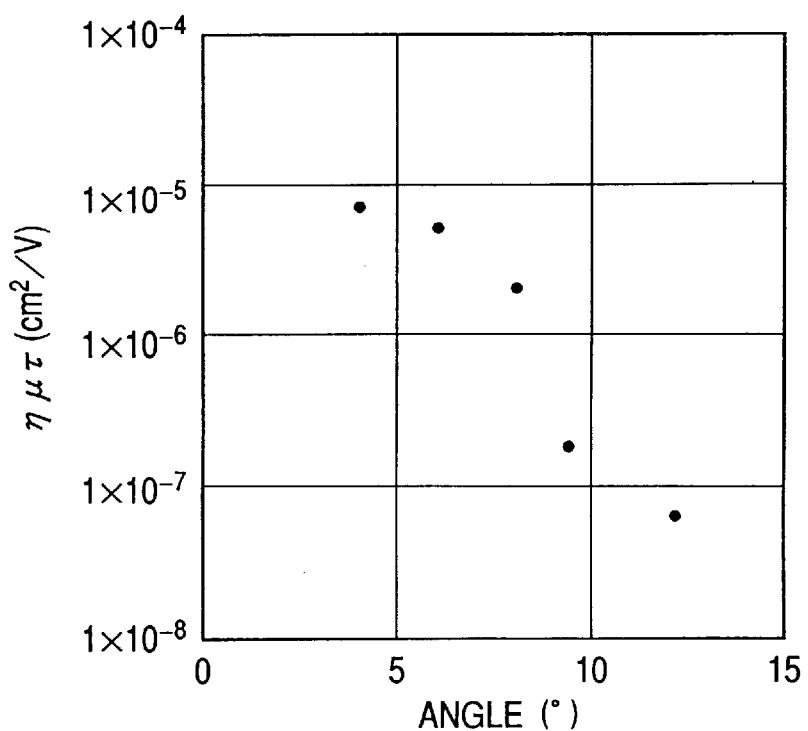
FIG. 6 illustrates the relationship between $\eta\mu\tau$ product and angles formed by the longer directions of crystal grains and the normal of substrate.

Observation of cross-sectional TEM (transmission electron microscopy) images of the photoconductive thin film according to the present invention has revealed that many columnar crystal grains are present and their longer directions are substantially perpendicular to the substrate. Examination of the relationship between photoconductivity and angles formed by the longer directions of columnar crystal grains and the normal of substrate has revealed that they have a negative correlation as shown in FIG. 6.

As a result of measurement of X-ray diffraction spectra of photoconductive thin films formed under various conditions and calculation by the Scherer's equation, it has been found that crystal grains have an average grain diameter in the range of from about 5 nm to about 300 nm.

Measurement of absorption spectra of the above photoconductive thin films by measurement of absorption and by CPM has revealed that, when the films have equal layer thickness, thin films whose crystal grains have an average grain diameter of from 20 nm to 200 nm have a large absorption coefficient in respect of light of 1.2 eV to 1.9 eV.

Figure 7:
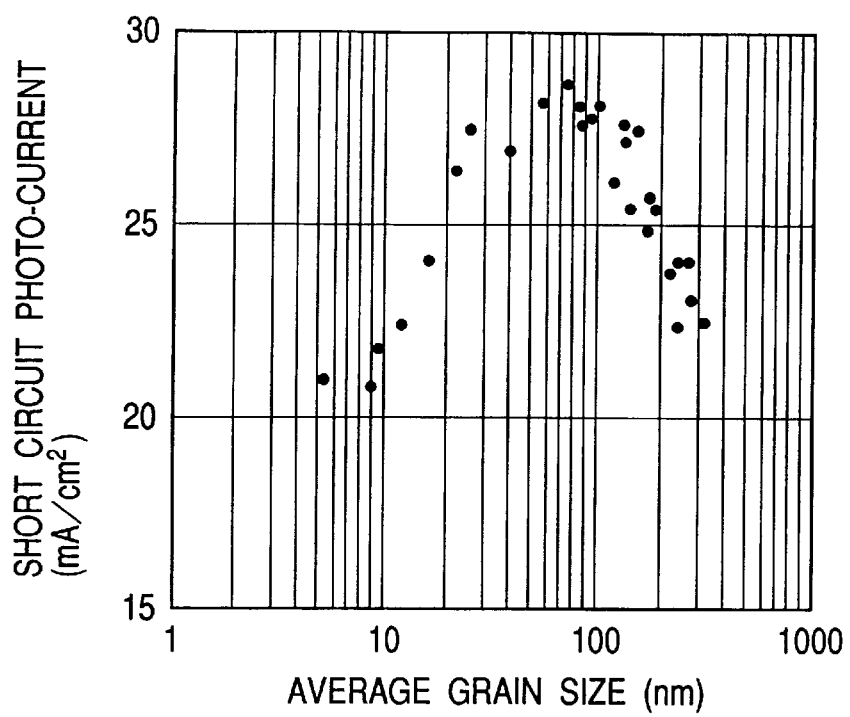
FIG. 7 illustrates the relationship between average grain diameter of crystal grains and short-circuit photocurrent.

Measurement of short-circuit photocurrent on photovoltaic devices described later, produced using the photoconductive thin film of the present invention, has obtained the results as shown in FIG. 7. Thus, in comparison under equal layer thickness, it has been found that the photoconductive thin film of the present invention in which the crystal grains have an average grain diameter of from 20 nm to 200 nm is especially superior.

Accordingly, it can be defined from the foregoing that a preferred range of the average grain diameter of the crystal grains is from 20 nm to 200 nm as calculated from the (220)-peak of silicon among X-ray diffraction peaks of the photoconductive thin film.

Figure 8:
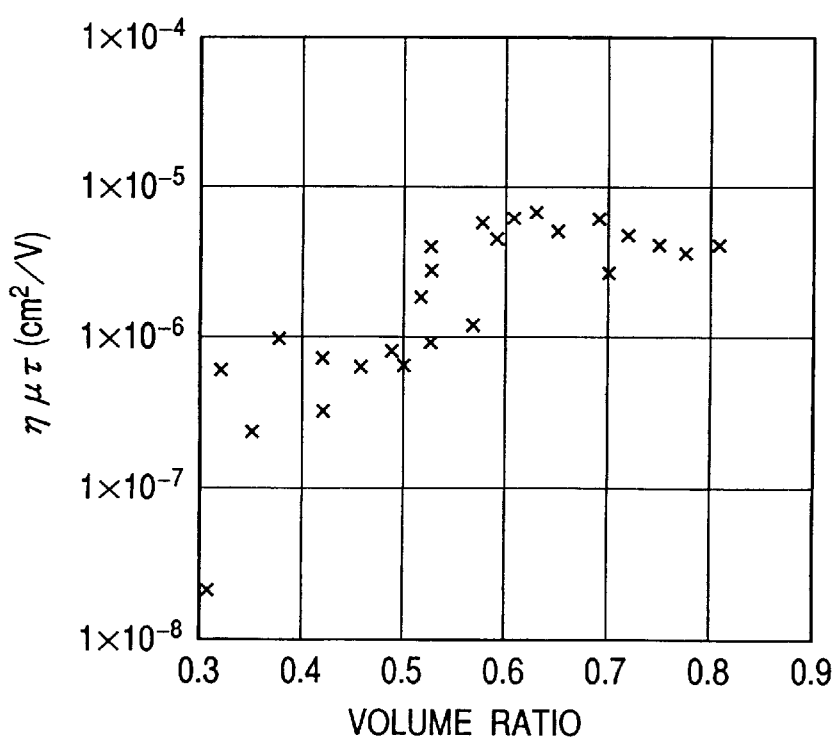
FIG. 8 illustrates the relationship between volume ratio of crystal grains and $\eta\mu\tau$ product.

Measuring the Raman spectra of photoconductive thin films produced under various conditions and separating the resultant peaks into peaks ascribable to a-Si and peaks ascribable to crystalline silicon, the volume ratio has approximately been calculated from the resultant peak intensity ratios. Measurement of $\eta\mu\tau$ product, made thereafter under 100-hour continuous irradiation by light of AM 1.5 (100 mW/cm$^2$), has obtained the results as shown in FIG. 8. That is, it has been found that the photoconductive thin film of the present invention whose crystalline regions are in a volume ratio of 50% or more has an especially good $\eta\mu\tau$ product of substantially $10^{-6}$ cm$^2$ or above.

More specifically, it can be defined that a preferred range of the volume ratio R of crystal grain region with respect to the volume of the whole thin film is R≧0.5 (R=volume of crystal grain region/volume of the whole thin film).

Figure 9:
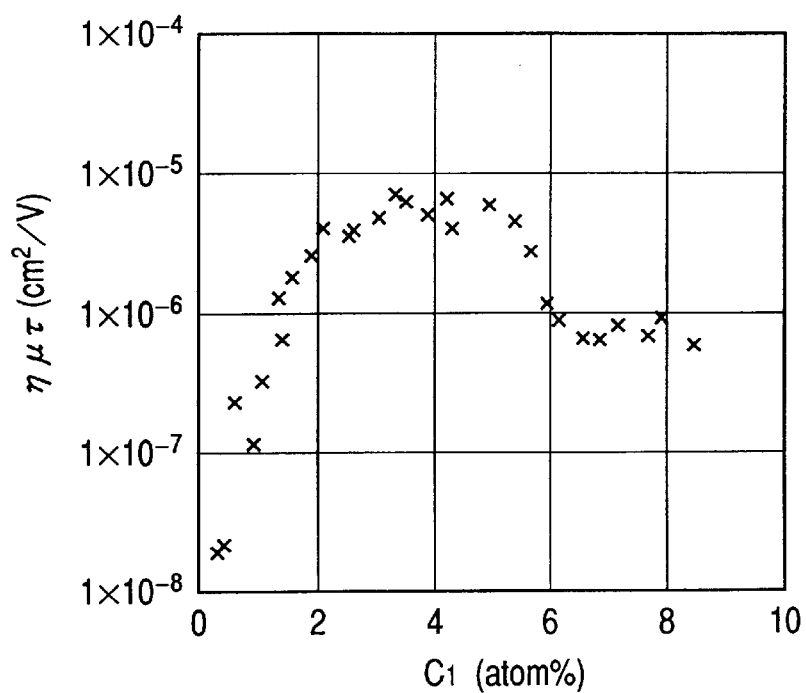
FIG. 9 illustrates the relationship between C1 and $\eta\mu\tau$ product.

Measurement of photoconductivity after 500-hour continuous irradiation by light of AM 1.5 (100 mW/cm$^2$) on photoconductive thin films formed under various conditions has revealed that the relationship between hydrogen content C1 ascribable to Si—H bonds and $\eta\mu\tau$ product in the film is as shown in FIG. 9. More specifically, it has been found that the photoconductive thin film of the present invention in which the hydrogen content ascribable to Si—H bonds is from 2 atom % to 6 atom % is especially superior.

To obtain the photoconductive thin film of the present invention, as described previously, the film may preferably be formed by plasma CVD making use of electromagnetic waves with a frequency of from 50 MHz to 900 MHz, using silicon-containing gas and hydrogen gas and at a pressure of from 10 mTorr to 500 mTorr and a substrate temperature of from 200° C. to 600° C.

Figure 10:
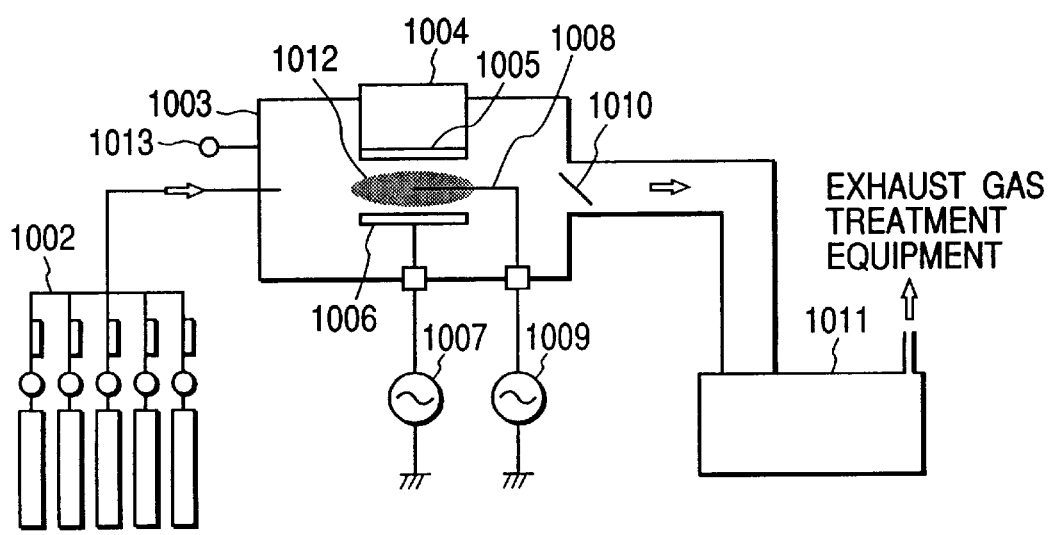
FIG. 10 is a schematic view of an example of a system used in producing the photoconductive thin film according to the present invention.

FIG. 10 is a schematic view of an example of a system used in producing the photoconductive thin film according to the present invention.

In FIG. 10, reference numeral 1002 denotes a material gas feed unit, which is constituted of gas cylinders, a pressure controller, mass-flow controllers, valves, feed lines and so forth. Reference numeral 1003 denotes a vacuum container; 1004, a heater for heating a substrate 1005; and 1006, an electrode A connected to a power source A (1007) and used to cause plasma 1012 to take place. Reference numeral 1008 denotes an electrode B for applying a bias to the plasma and is connected to a power source B (1009). Reference numeral 1010 denotes a conductance valve for controlling the pressure inside the vacuum container; and 1011, an exhaust system, where exhaust gas is led to an exhaust gas treatment equipment (not shown). Reference numeral 1013 denotes a pressure sensor which detects the pressure inside the vacuum container 1003.

Its high-frequency power source may preferably be set at a frequency of from 50 to 900 MHz, and bias power source at a frequency of from 0 to 30 MHz. The pressure may preferably be set at from 10 to 500 mTorr, and substrate temperature at from 200 to 600° C. As material gases, silane ($SiH_4$), hydrogen ($H_2$), methane ($CH_4$), phosphine ($PH_3$) and boron fluoride ($BF_3$) may be used.

In the exhaust system, an oil diffusion pump, a turbo-molecular pump or a dry pump may be used.

EXAMPLES (Example 1)

The production apparatus shown in FIG. 10 was used. Its power source A was set at a frequency of 100 MHz; the distance between the electrode A and the substrate, at 40 mm; and the power source B, at a frequency of 13.56 MHz. The electrode B was placed at a position intermediate between the electrode A and the substrate. As an exhaust means in the exhaust system, an oil diffusion pump was used. As material gases, silane ($SiH_4$) and hydrogen ($H_2$) were used. As the substrate, a glass plate of 5 cm×5 cm and 1 mm thick was used.

Conditions for thin-film formation are shown in Table 1 [Table 1(A)–1(B)].

The photoconductive thin film formed was taken out to measure its absorption of light and Raman spectrum, and then an electrode was vacuum-deposited on the film to measure Urbach energy Eu by CPM and measure $\eta\mu\tau$ product. From the Raman spectrum obtained, both wave-number shift at 480 (1/cm) and wave-number shift at 520 $cm^{-1}$ were seen, the former indicating amorphous silicon (a-Si) and the latter indicating crystalline silicon. The Urbach energy Eu at 0.9 eV to 1.1 eV in the vicinity of 1.0 eV of photon energy and the $\eta\mu\tau$ product were as shown in Table 1. Observation of cross-sectional TEM images has revealed that crystal grains in the film have columnar shape.

(Comparative Example 1)

A photoconductive thin film was produced under conditions as shown in Table 1, changing the distance between the electrode A and the substrate to 100 mm, and measurement was made in the same manner as in Example 1. From the Raman spectrum obtained, both wave-number shift at 480 $cm^{-1}$ and wave-number shift at 520 (1/cm) were seen, the former indicating amorphous silicon (a-Si) and the latter indicating crystalline silicon. The Urbach energy Eu and the $\eta\mu\tau$ product were as shown in Table 1. Incidentally, the crystal grains in the film had not especially a characteristic shape.

As shown in Table 1, the photoconductive thin film of Example 1 was found to have solar cell characteristics superior to those of Comparative Example 1.

(Example 2)

Figure 11:
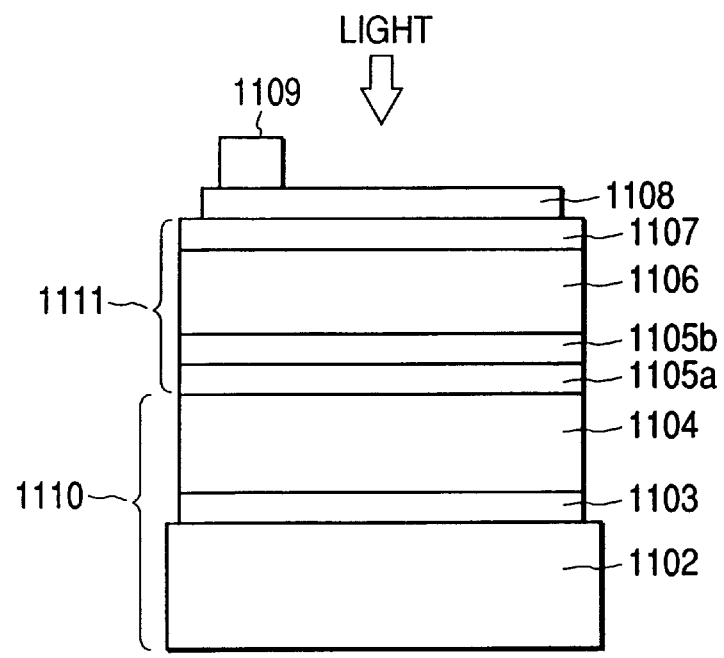
FIG. 11 is a diagrammatic view showing a cross-sectional structure of an example of the photovoltaic device according to the present invention.

Using the photoconductive thin film produced in Example 1, the photovoltaic device shown in FIG. 11 (a p-i-n type solar cell) was produced. More specifically, this photovoltaic device is constituted of a back reflective layer 1103, a back transparent conductive layer 1104, a p-i-n junction layer 1111, a transparent conductive layer 1108 and a collector electrode 1109 which are superposed on a support 1102.

A substrate 1110 is constituted of the support 1102, the back reflective layer 1103 and the back transparent conductive layer 1104. Stated specifically, used was a substrate comprising a support of a 5 cm×5 cm and 1 mm thick stainless steel sheet, a 600 nm thick silver thin film formed thereon at a temperature of 300° C. and a 2,500 nm thick zinc oxide (ZnO) further formed thereon by sputtering at 300° C. This substrate had a surface roughness Ra of 0.18 µm.

The p-i-n junction layer is constituted of an n-type n1 layer 1105a, an n-type n2 layer 1105b, an i-type layer 1106 and a p-type layer 1107. Stated specifically, the n-type n1 layer 1105a is formed as an a-Si:H:P thin film, the n-type n2 layer 1105b as a µc-Si:H thin film, the i-type layer 1106 as the photoconductive thin film of the present invention, and the p-type layer 1107 as a µc-Si:H:B thin film.

In the formation of the respective layers by the use of the system shown in FIG. 10, the inside of the vacuum container was purged thoroughly so that the film formation was not affected by any residual gas. The layers were formed under conditions shown together in Table 2 [Table 2(A)–2(B)].

Next, a transparent conductive layer comprising ITO was formed by sputtering, and a comb collector electrode was further formed by EB (electron beam) vacuum deposition. Current and voltage characteristics (IV) of the solar cell thus produced was measured under a solar simulator (AM 1.5, 100 $mW/cm^2$), and solar cell characteristics (open-circuit voltage Voc, short-circuit photocurrent Jsc and conversion efficiency) were determined to obtain the results as shown in Table 2.

(Comparative Example 2)

In Comparative Example 2, an i-type layer was formed under the same conditions as in Comparative Example 1, and a photovoltaic device was produced in the same manner as in Example 2. Measurement was made in the same manner as in Example 1 to obtain the results as shown in Table 2.

Thus, the photovoltaic device of Example 2 was found to have solar cell characteristics superior to those of Comparative Example 2.

(Example 3)

Figure 12:
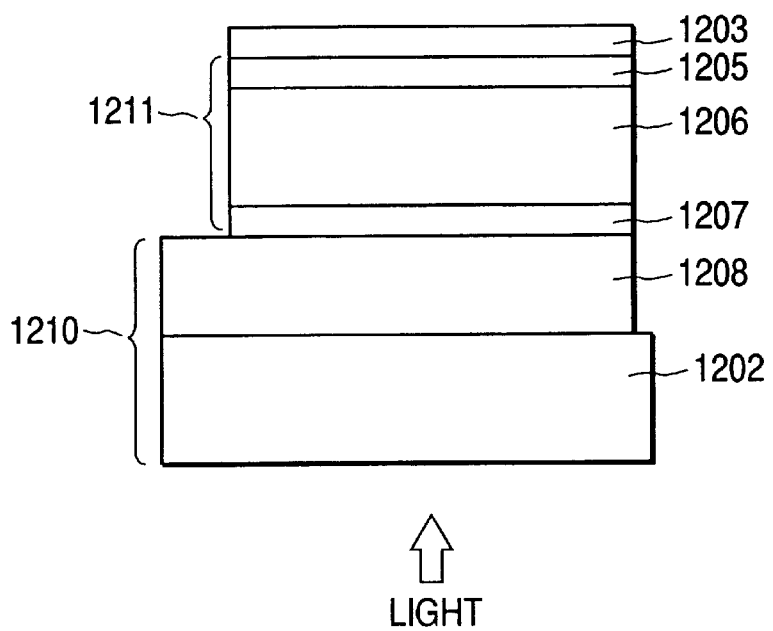
FIG. 12 is a diagrammatic view showing a cross-sectional structure of another example of the photovoltaic device according to the present invention.

The photovoltaic device shown in FIG. 12 (a p-i-n type solar cell) was produced. This photovoltaic device is a device of the type the light is received on the substrate side, and is constituted basically of a substrate 1210, a p-i-n junction layer 1211 and a back reflective layer 1203.

The substrate 1210 is constituted of a transparent support 1202 formed of a glass plate and a transparent conductive layer 1208 formed of $SnO_2$.

The p-i-n junction layer 1211 is constituted of a p-type layer 1207 comprised of a μc-Si:H:B thin film, an i-type layer 1206 comprised of the photoconductive thin film of the present invention and an n-type layer 1205 comprised of an μc-Si:H:P thin film.

The transparent conductive layer 1208 formed of $SnO_2$ was formed by sputtering, and the one having a surface-textured structure was used. The p-i-n junction layer was formed in the same manner as in Example 2. The i-type layer was formed in the same manner as in Example 1. Formation conditions for these are shown in Table 3.

The reflective layer 1203, formed of silver, was formed by EB vacuum deposition. Solar cell characteristics were measured in the same manner as in Example 1. Results obtained are shown in Table 3 [Table 3(A)–3(B)].

Thus, the photoconductive thin film of Example 3 was found to have superior solar cell characteristics.

(Example 4)

Under conditions shown in Table 4, photoconductive thin films of Examples 4a, 4b, 4c and 4d according to the present invention were formed on glass substrates and single-crystal silicon substrates. Measurement of light absorption, measurement by CPM and measurement of infrared absorption were made, and Urbach energy Eu, $\eta\mu\tau$ product and hydrogen content were determined. Results obtained are shown in Table 4 [Table 4(A)–4(B)].

Thereafter, the films were left for 500 hours under a solar simulator (AM 1.5, 100 mW/cm²), and the $\eta\mu\tau$ product was again determined to find that the films little deteriorated. Incidentally, observation of cross-sectional TEM images revealed that columnar crystal grains were present in the films of Examples 4a, 4b, 4c and 4d.

As shown in Table 4, the photoconductive thin films of Examples 4a, 4c and 4d were found to have solar cell characteristics superior to those of the photoconductive thin film of Example 4b even under irradiation by light for a long time.

(Example 5)

A solar cell making use of the photoconductive thin film containing columnar crystal grains whose longer directions are substantially perpendicular to the substrate surface was produced. The same photovoltaic device as that of Example 2 was produced, except that the i-type layer was formed under conditions as shown in Table 5 [Table 5(A)–5(B)]. After measurement of solar cell characteristics and Urbach energy Eu, cross-sectional TEM images in dark visual field were observed to examine the shape and direction of the crystal grains.

As the result, it was found that the crystal grains had columnar shape, and their longer directions were substantially perpendicular to the substrate surface and at an average angle of 4.2° to the normal of the substrate. The crystal grains in the i-type layer of the photovoltaic device of Example 2 were also columnar crystal grains and their longer directions were substantially perpendicular to the substrate surface, but at an average angle of 8.2° to the normal of the substrate. In the photovoltaic device of Comparative Example 2, the crystal grains in the i-type layer had not especially a characteristic shape.

Thus, the photovoltaic devices having the photoconductive thin film containing columnar crystal grains whose longer directions are substantially perpendicular to the substrate surface were found to have superior solar cell characteristics.

(Example 6)

Photovoltaic devices making use of the photoconductive thin film of the present invention in which crystal grain region is in a volume ratio R of R≧0.5 was produced. Photovoltaic devices of Example 6a and 6b were produced in the same manner as in Example 2 except that their i-type layers were formed under conditions as shown in Table 6 [Table 6(A)–6(B)].

Solar cell characteristics and Urbach energy Eu of the devices thus produced were measured, and also Raman scattering spectrum was measured to determine the intended volume ratio. Results obtained are shown in Table 6.

These photovoltaic devices were also irradiated continuously for 500 hours by light of AM 1.5 (100 mW/cm²), and thereafter the solar cell characteristics were again measured. Results obtained are shown in Table 6. Incidentally, observation of cross-sectional TEM images revealed that columnar crystal grains were present in the i-type layers of Examples 6a and 6b.

(Comparative Example 3)

Photovoltaic devices of Comparative Examples 3a and 3b were produced in the same manner as in Example 2 except that their i-type layers were formed under conditions as shown in Table 6, and measurement was made in the same manner as in Example 6. Results obtained are shown in Table 6.

Thus, the photovoltaic devices of Examples 6a and 6b in which the crystal grain region is in a volume ratio R of R≧0.5 were found to cause little light degradation of solar cell characteristics even after continuous irradiation by strong light, compared with those of Comparative Examples 3a and 3b.

(Example 7)

Figure 13:
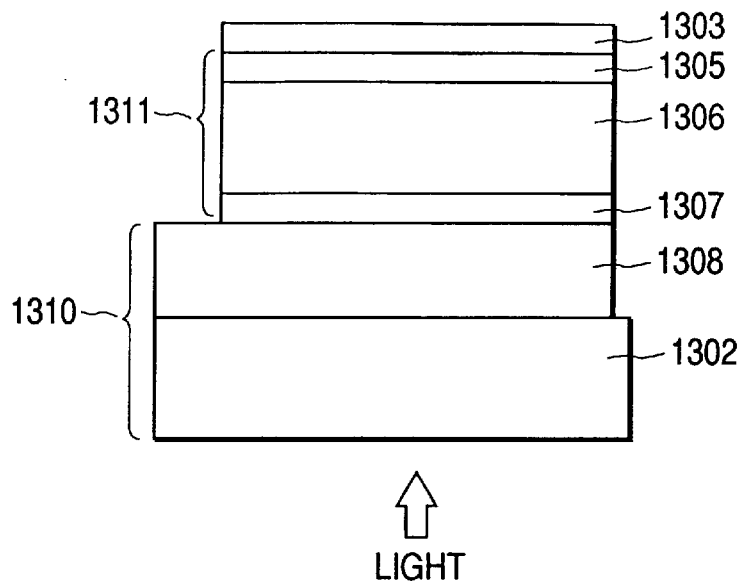
FIG. 13 is a diagrammatic view showing a cross-sectional structure of still another example of the photovoltaic device according to the present invention.

A photovoltaic device (solar cell) having the cross-sectional structure as shown in FIG. 13 was produced. This photovoltaic device comprises a substrate 1310 and formed successively thereon a back reflective layer 1303, a photovoltaic p⁺-p⁻-n⁺ junction layer 1311 and a transparent conductive layer 1308.

As the substrate 1310 and the back reflective layer 1303, the same as those in Example 3 were used. A p⁺-type layer 1307 and an n⁺-type layer 1305 were formed under the same conditions as the p-type layer in Example 3 and the n-type layer in Example 4, respectively. A p⁻-type layer 1306 was formed under the same conditions as the i-type layer in Example 3 but, in addition thereto, boron fluoride ($BF_3$) was flowed at a rate of 0.6 sccm.

Solar cell characteristics of the device obtained were measured to find that, like Example 3, it had superior characteristics. A single layer of the p⁻-type layer was also formed on a glass substrate and a comb electrode was further formed on the p⁻-type layer, to make measurement by CPM and measurement of conductivity activation energy. As a result, the Urbach energy Eu was found to be 55 meV. The activation energy was also found to be 0.42 eV and the conductivity type was confirmed to be p⁻-type.

This photovoltaic device was also irradiated continuously for 500 hours by light of AM 1.5 (100 mW/cm$^2$) and thereafter the solar cell characteristics were again measured, where the solar cell characteristics little changed. Incidentally, observation of cross-sectional TEM images revealed that columnar crystal grains were present in the p$^-$-type layer of Example 7.

(Example 8)

A photovoltaic device was produced, having the same structure as that of Example 7 except that the p$^-$-type layer was replaced with an n$^-$-type layer. The n$^-$-type layer was formed under the same conditions as the i-type layer in Example 3 but, in addition thereto, phosphine (PH$_3$) was flowed at a rate of 0.3 sccm.

Solar cell characteristics of the device obtained were measured to find that, like Example 3, it had superior characteristics. A single layer of the n$^-$-type layer was also formed on a glass substrate and a comb electrode was further formed on the n$^-$-type layer, to make measurement by CPM and measurement of conductivity activation energy. As a result, the Urbach energy Eu was found to be 54 meV. The activation energy was also found to be 0.39 eV and the conductivity type was confirmed to be n$^-$-type.

This photovoltaic device was also irradiated continuously for 500 hours by light of AM 1.5 (100 mW/cm$^2$) and thereafter the solar cell characteristics were again measured, where the solar cell characteristics little changed. Incidentally, observation of cross-sectional TEM images revealed that columnar crystal grains were present in the n$^-$-type layer of Example 8.

(Example 9)

The photovoltaic device of the present invention was produced in which an additional p-i-n junction layer A is formed between the p-i-n junction layer and the transparent conductive layer and an i-type layer A constituting the p-i-n junction layer A is formed of amorphous silicon containing hydrogen. Its constitution is shown in FIG. 14.

Figure 14:
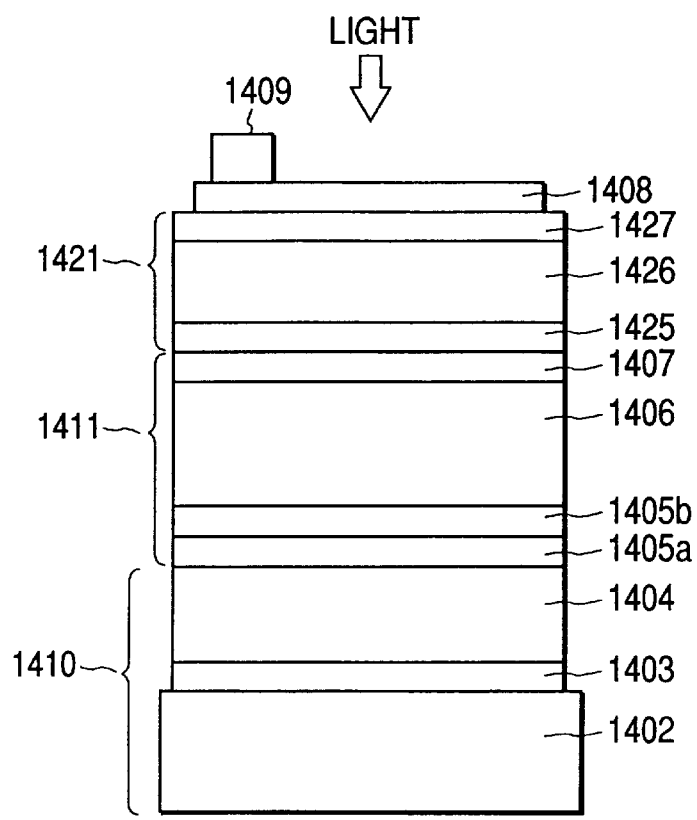
FIG. 14 is a diagrammatic view showing a cross-sectional structure of still another example of the photovoltaic device (a tandem type) according to the present invention.

In the device shown in FIG. 14, a substrate 1410 and a p-i-n junction layer 1411 are constituted in the same manner as the layers in Example 2. More specifically, the substrate 1410 is constituted of a support 1402, a back reflective layer 1403 and a back transparent conductive layer 1404. Stated specifically, used was a substrate comprising a support of a 5 cm×5 cm and 1 mm thick stainless steel sheet, a 600 nm thick silver thin film formed thereon at a temperature of 300° C. and a 2,500 nm thick zinc oxide (ZnO) further formed thereon by sputtering at 300° C. This substrate had a surface roughness Ra of 0.18 μm.

The p-i-n junction layer is constituted of an n-type n1 layer 1405a, an n-type n2 layer 1405b, an i-type layer 1406 and a p-type layer 1407. Stated specifically, the n-type n1 layer 1405a is formed as an a-Si:H:P thin film, the n-type n2 layer 1405b as a μc-Si:H thin film, the i-type layer 1406 as the photoconductive thin film of the present invention, and the p-type layer 1407 as a μc-Si:H:B thin film.

The additional p-i-n junction layer A 1421 formed between the p-i-n junction layer and the transparent conductive layer 1408 is constituted of an n-type layer A 1425 comprised of an amorphous silicon thin film (a-Si:H:P), an i-type layer A 1426 comprised of an amorphous silicon thin film (a-Si:H) and a p-type layer A 1427 comprised of a microcrystalline silicon thin film (μc-Si:H:B).

Conditions for forming the respective layers and results obtained by measurement of solar cell characteristics are shown in Table 7 [Table 7(A)–7(B)].

Thereafter, the device was left for 150 hours in an atmosphere of 120° C. air, which was then restored to room temperature, and the solar cell characteristics were measured. Results obtained are also shown in Table 7 together. As the result of measurement, the photovoltaic device of the present invention was found to have superior heat resistance. Measurement by CPM was made on a single layer formed under the conditions for the i-type layer and on which a comb electrode was formed by vacuum deposition. Observation of cross-sectional TEM images revealed that columnar crystal grains were present in the i-type layer of Example 9.

Temperature of photovoltaic devices was changed from 25° C. to 90° C., and their conversion efficiency was measured to determine temperature characteristics of conversion efficiency. As the result, the temperature characteristics of conversion efficiency of the photovoltaic device of Example 9 were −0.035%/° C. Meanwhile, the temperature characteristics of conversion efficiency of the photovoltaic device of Example 2 were −0.046%/° C., and the temperature characteristics of conversion efficiency of the photovoltaic device of Comparative Example 2 were −0.052%/° C. From these facts, the temperature characteristics of conversion efficiency of the photovoltaic device of Example 9 were found to be improved reasonably, compared with those of Example 2 and Comparative Example 2.

(Comparative Example 4)

The procedure of Example 9 was repeated except that the i-type layer formed therein was formed under the conditions as shown in Table 7 and the transparent conductive layer 1408 was formed by EB vacuum deposition. Measurement was made in the same manner to obtain the results as shown together in Table 7.

Thus, the photovoltaic device of Example 9 was found to have solar cell characteristics and heat resistance superior to those of Comparative Example 4.

(Example 10)

Layer formation was carried out under the same conditions as in Example 9 except that, when the i-type layer was formed therein, phosphine gas was flowed at a rate of 0.1 sccm. Observation of cross-sectional TEM images revealed that columnar crystal grains were present in the film of this layer. Measurement of solar cell characteristics and heat resistance test were also made similarly to find that the photovoltaic device obtained had superior solar cell characteristics and heat resistance like those in Example 9.

(Example 11)

A photovoltaic device was produced whose back transparent conductive layer has a surface roughness Ra of 0.35 μm. The photovoltaic device was produced in the same manner as in Example 2 except that the back transparent conductive layer was formed in a layer thickness of 4,000 nm at a temperature of 350° C.

Its solar cell characteristics were measured to find that it had a short-circuit photocurrent and a conversion efficiency of 1.036 times and 1.056 times those of the photovoltaic device of Example 2, respectively, having superior solar cell characteristics.

(Example 12)

A photovoltaic device was produced in which a copper magnesium (Cu$_2$Mg) layer formed by DC magnetron sputtering at 300° C. was used as the back reflective layer. The photovoltaic device was produced under the same layer formation conditions as in Example 2 except that the silver was replaced with the above copper magnesium. After its solar cell characteristics were measured, the device was left in an environment of a high temperature of 85° C. and a high humidity of 85% for 150 hours while applying a reverse bias of −1 V to the collector electrode, which was then restored to an environment of normal temperature to measure its solar cell characteristics. As a result, the characteristics were seen to little lower.

(Example 13)

A photovoltaic device was produced under the same constitution and conditions as in Example 9 except that, when the i-type layer A was formed therein, methane gas ($CH_4$) was flowed at a rate of 3 sccm.

As the result, the optimum operating voltage and optimum operating electric current of this photovoltaic device were 1.05 times and 0.91 time those of the photovoltaic device of Example 9, respectively. Its conversion efficiency was 0.96 time the same, but, when photovoltaic devices were connected in series to provide a module, the comb electrode was able to be narrowed correspondingly to the operating electric current which was able to be made lower. It was also possible to reduce the power loss due to sheet resistance of the transparent conductive layer.

Thus, it was possible for the photovoltaic device of Example 13 to be improved in module efficiency.

As having been described above, the photoconductive thin film of the present invention has a superior photoconductivity and causes little light degradation. Also, the photovoltaic device making use of the photoconductive thin film of the present invention has superior open-circuit voltage, short-circuit photocurrent and photoelectric conversion efficiency and causes little light degradation. The tandem type photovoltaic device according to the present invention also has superior open-circuit voltage, short-circuit photocurrent and photoelectric conversion efficiency, causes little light degradation, and also have superior heat resistance and temperature characteristics. Moreover, since any expensive gas such as germane need not be used, the photovoltaic device can be made low-cost.

TABLE 1(A)

| | Gas flow rate | | | | Power source A | | Electrode A-to-substrate | Power source B | |
|---|---|---|---|---|---|---|---|---|---|
| | $SiH_4$ (sccm) | $H_2$ (sccm) | $PH_3$ (sccm) | $BF_3$ (sccm) | Frequency (MHz) | Power (W) | distance (mm) | Frequency (MHz) | Power (W) |
| Example 1 | 60 | 2,000 | 0 | 0 | 100 | 200 | 40 | 13.56 | 5 |
| Comparative Example 1 | 60 | 1,200 | 0 | 0 | 100 | 400 | 100 | 13.56 | 5 |

TABLE 1(B)

| | Pressure (Torr) | Temperature (° C.) | Layer thickness (nm) | Eu (meV) | $\eta\nu\tau$ ($cm^2/V$) |
|---|---|---|---|---|---|
| Example 1 | 0.2 | 250 | 1,050 | 56 | $2.0 \times 10^{-6}$ |
| Comparative Example 1 | 0.2 | 250 | 1,070 | 75 | $4.5 \times 10^{-7}$ |

TABLE 2(A)

| | Gas flow rate | | | | Power source A | | Electrode A-to-substrate | Power source B | |
|---|---|---|---|---|---|---|---|---|---|
| | $SiH_4$ (sccm) | $H_2$ (sccm) | $PH_3$ (sccm) | $BF_3$ (sccm) | Frequency (MHz) | Power (W) | distance (mm) | Frequency (MHz) | Power (W) |
| Example 2 | | | | | | | | | |
| n1-layer: | 4 | 50 | 0.01 | 0 | — | — | — | 13.56 | 5 |
| n2-layer: | 0.5 | 80 | 0.1 | 0 | — | — | — | 13.56 | 30 |
| i-layer: | 60 | 2,000 | 0 | 0 | 100 | 200 | 40 | 13.56 | 5 |
| p-layer: | 0.5 | 100 | 0 | 0.2 | — | — | — | 13.56 | 5 |
| Comparative Example 2 | | | | | | | | | |
| n1-layer: | 4 | 50 | 0.01 | 0 | — | — | — | 13.56 | 5 |
| n2-layer: | 0.5 | 80 | 0.1 | 0 | — | — | — | 13.56 | 30 |
| i-layer: | 60 | 1,200 | 0 | 0 | 100 | 400 | 100 | 13.56 | 5 |
| p-layer: | 0.5 | 100 | 0 | 0.2 | — | — | — | 13.56 | 5 |

TABLE 2(B)

|  | Pressure (Torr) | Temperature (° C.) | Layer thickness (nm) | Voc (mA/cm²) | Jsc (mA/cm²) | Conversion efficiency (%) |
| --- | --- | --- | --- | --- | --- | --- |
| Example 2 |  |  |  | 0.482 | 25.4 | 8.13 |
| n1-layer: | 1 | 250 | 10 |  |  |  |
| n2-layer | 0.5 | 250 | 10 |  |  |  |
| i-layer | 0.2 | 250 | 1,050 |  |  |  |
| p-layer | 0.5 | 150 | 5 |  |  |  |
| Comparative Example 2 |  |  |  | 0.430 | 23.8 | 5.37 |
| n1-layer | 1 | 250 | 10 |  |  |  |
| n2-layer | 0.5 | 250 | 10 |  |  |  |
| i-layer | 0.2 | 250 | 1,070 |  |  |  |
| p-layer | 0.5 | 150 | 5 |  |  |  |

TABLE 3(A)

|  | Gas flow rate | | | | Power source A | | Electrode A-to-substrate | Power source B | |
| --- | --- | --- | --- | --- | --- | --- | --- | --- | --- |
|  | SiH₄ (sccm) | H₂ (sccm) | PH₃ (sccm) | BF₃ (sccm) | Frequency (MHz) | Power (W) | distance (mm) | Frequency (MHz) | Power (W) |
| Example 3 |  |  |  |  |  |  |  |  |  |
| p-layer: | 0.5 | 100 | 0 | 0.2 | — | — | — | 13.56 | 5 |
| i-layer: | 60 | 2,000 | 0 | 0 | 100 | 200 | 40 | 13.56 | 5 |
| n-layer: | 0.5 | 80 | 0.1 | 0 | — | — | — | 13.56 | 30 |

TABLE 3(B)

|  | Pressure (Torr) | Temperature (° C.) | Layer thickness (nm) | Voc (mA/cm²) | Jsc (mA/cm²) | Conversion efficiency (%) |
| --- | --- | --- | --- | --- | --- | --- |
| Example 3 |  |  |  | 0.485 | 25.2 | 8.07 |
| p-layer: | 0.5 | 250 | 5 |  |  |  |
| i-layer: | 0.2 | 250 | 1,050 |  |  |  |
| n-layer: | 0.5 | 150 | 10 |  |  |  |

TABLE 4(A)

|  | Gas flow rate | | | | Power source A | | Electrode A-to-substrate | Power source B | |
| --- | --- | --- | --- | --- | --- | --- | --- | --- | --- |
|  | SiH₄ (sccm) | H₂ (sccm) | PH₃ (sccm) | BF₃ (sccm) | Frequency (MHz) | Power (W) | distance (mm) | Frequency (MHz) | Power (W) |
| Example 4a | 80 | 2,200 | 0 | 0 | 100 | 200 | 40 | 13.56 | 5 |
| Example 4b | 60 | 1,300 | 0 | 0 | 100 | 300 | 100 | 13.56 | 5 |
| Example 4c | 80 | 2,400 | 0 | 0 | 100 | 200 | 40 | 13.56 | 5 |
| Example 4d | 80 | 2,400 | 0 | 0 | 100 | 400 | 100 | 13.56 | 10 |

TABLE 4(B)

|  | Pressure (Torr) | Temperature (° C.) | Layer thickness (nm) | Eu (meV) | C1/C2 | C1 + C2 (%) | ημτ (cm²/V) | ημτ after irradiation (cm²/V) |
|---|---|---|---|---|---|---|---|---|
| Example 4a | 0.25 | 200 | 950 | 58 | 2.24 | 8.1 | $3.5 \times 10^{-6}$ | $2.8 \times 10^{-6}$ |
| Example 4b | 0.25 | 200 | 960 | 48 | 0.4 | 2.3 | $1.9 \times 10^{-7}$ | $1.2 \times 10^{-7}$ |
| Example 4c | 0.15 | 200 | 950 | 45 | 2.21 | 7.7 | $5.3 \times 10^{-6}$ | $4.5 \times 10^{-6}$ |
| Example 4d | 0.15 | 200 | 960 | 52 | 1.87 | 6.6 | $4.3 \times 10^{-6}$ | $4.1 \times 10^{-6}$ |

TABLE 5(A)

|  | Gas flow rate | | | | Power source A | | Electrode A-to-substrate | Power source B | |
|---|---|---|---|---|---|---|---|---|---|
|  | $SiH_4$ (sccm) | $H_2$ (sccm) | $PH_3$ (sccm) | $BF_3$ (sccm) | Frequency (MHz) | Power (W) | distance (mm) | Frequency (MHz) | Power (W) |
| Example 5 | 60 | 2,000 | 0 | 0 | 100 | 200 | 40 | 13.56 | 15 |

TABLE 5(B)

|  | Pressure (Torr) | Temperature (° C.) | Layer thickness (nm) | Eu of i-layer (meV) | Average angle to normal (°) | Voc (mA/cm²) | Jsc (mA/cm²) | Conversion efficiency (%) |
|---|---|---|---|---|---|---|---|---|
| Example 5 | 0.2 | 250 | 1,050 | 47 | 4.2 | 0.491 | 26.1 | 8.35 |

TABLE 6(A)

|  | Gas flow rate | | | | Power source A | | Electrode A-to-substrate | Power source B | |
|---|---|---|---|---|---|---|---|---|---|
|  | $SiH_4$ (sccm) | $H_2$ (sccm) | $PH_3$ (sccm) | $BF_3$ (sccm) | Frequency (MHz) | Power (W) | distance (mm) | Frequency (MHz) | Power (W) |
| Example 6a | 80 | 2,500 | 0 | 0 | 300 | 200 | 40 | 13.56 | 10 |
| Example 6b | 60 | 2,000 | 0 | 0 | 100 | 200 | 40 | 13.56 | 5 |
| Comparative Example 3a | 80 | 2,500 | 0 | 0 | 300 | 300 | 100 | 13.56 | 15 |
| Comparative Example 3b | 80 | 2,000 | 0 | 0 | 300 | 200 | 40 | 13.56 | 20 |

TABLE 6(B)

|  | Pressure (Torr) | Temperature (° C.) | Layer thickness (nm) | Eu of i-layer (meV) | Volume ratio R (°) | After irradiation at AM 1.5 (100 mW/cm²) for 500 hrs | | | |
|---|---|---|---|---|---|---|---|---|---|
|  |  |  |  |  |  | Voc (mA/cm²) | Jsc (mA/cm²) | Conversion efficiency (%) | Rate of change in CE |
| Example 6a | 0.2 | 250 | 930 | 55 | 0.81 | 0.482 | 25.2 | 8.16 | 0.984 |
| Example 6b | 0.2 | 250 | 1,050 | 56 | 0.52 | 0.481 | 25.3 | 8.03 | 0.988 |
| Comparative Example 3a | 0.2 | 180 | 940 | 63 | 0.46 | 0.457 | 22.7 | 5.45 | 0.864 |
| Comparative Example 3b | 0.25 | 420 | 960 | 77 | 0.41 | 0.443 | 23.6 | 5.77 | 0.864 |

TABLE 7(A)

|  | Gas flow rate | | | | Power source A | | Electrode A-to-substrate | Power source B | |
|---|---|---|---|---|---|---|---|---|---|
|  | SiH$_4$ (sccm) | H$_2$ (sccm) | PH$_3$ (sccm) | BF$_3$ (sccm) | Frequency (MHz) | Power (W) | distance (mm) | Frequency (MHz) | Power (W) |
| Example 9 | | | | | | | | | |
| n1-layer: | 4 | 50 | 0.01 | 0 | — | — | — | 13.56 | 5 |
| n2-layer: | 0.5 | 80 | 0.1 | 0 | — | — | — | 13.56 | 30 |
| i-layer: | 60 | 2,400 | 0 | 0 | 100 | 200 | 40 | — | — |
| p-layer: | 0.5 | 100 | 0 | 0.2 | — | — | — | 13.56 | 5 |
| n-layer A: | 4 | 50 | 0.01 | 0 | — | — | — | 13.56 | 5 |
| i-layer A: | 4 | 50 | 0 | 0 | — | — | — | 13.56 | 3 |
| p-layer A: | 0.5 | 100 | 0 | 0.2 | — | — | — | 13.56 | 5 |
| Comparative Example 4 | | | | | | | | | |
| i-layer: | 60 | 1,200 | 0 | 0 | 100 | 400 | 40 | 13.56 | 5 |

CE: Conversion efficiency

TABLE 7(B)

|  | Pressure (Torr) | Temperature (° C.) | Layer thickness (nm) | Eu of i-layer (meV) | Voc (mA/cm$^2$) | Jsc (mA/cm$^2$) | Conversion efficiency (%) | CE after heat resistance test (%) |
|---|---|---|---|---|---|---|---|---|
| Example 9 | | | | | | | | |
| n1-layer: | 1 | 250 | 10 | 52 | 1.408 | 12.6 | 12.7 | 12.6 |
| n2-layer: | 0.5 | 250 | 10 | | | | | |
| i-layer: | 0.2 | 250 | 1,180 | | | | | |
| p-layer: | 0.5 | 200 | 5 | | | | | |
| n-layer A: | 1 | 225 | 10 | | | | | |
| i-layer A: | 1.2 | 225 | 360 | | | | | |
| p-layer A: | 0.5 | 150 | 5 | | | | | |
| Comparative Example 4 | | | | | | | | |
| i-layer: | 0.2 | 250 | 1,150 | 75 | 1.363 | 11.8 | 11.2 | 10.1 |

CE: conversion efficiency

What is claimed is:

1. A photoconductive thin film formed on a substrate and containing at least hydrogen and crystal grains of silicon, wherein the crystal grains of silicon are columnar in shape, and the photoconductive thin film has an Urbach energy Eu of 60 meV or less, as measured by a constant photocurrent method.

2. The photoconductive thin film according to claim 1, wherein the Urbach energy Eu is from 0.9 eV to 1.1 eV, in the vicinity of 1.0 eV of photon energy.

3. The photoconductive thin film according to claim 1, wherein a hydrogen content C1 atom % ascribable to Si—H bonds and a hydrogen content C2 atom % ascribable to Si—H$_2$ bonds are such that C1/C2≧0.8 and 3≦C1+C2≦8.

4. The photoconductive thin film according to claim 3, wherein the hydrogen content C1 ascribable to the Si—H bonds is from 2 atom % to 6 atom %.

5. The photoconductive thin film according to claim 1, wherein each of the crystal grains has an angle not larger than 8° which is formed by the longer direction of each of the crystal grains and the normal direction of a surface of the substrate.

6. The photoconductive thin film according to claim 1, wherein the crystal grains of silicon have an average grain diameter from 20 nm to 200 nm, as calculated from the (220)-peak of silicon among x-ray diffraction peaks of the photoconductive thin film.

7. The photoconductive thin film according to claim 1, further containing amorphous silicon, wherein a ratio R of the volume of the crystal grains of silicon to the volume of the photoconductive thin film is R≧0.5.

8. The photoconductive thin film according to claim 1, which is formed by plasma CVD using electromagnetic waves with a frequency from 50 MHz to 900 MHz, a silicon-containing gas and hydrogen gas, a pressure from 10 mTorr to 500 mTorr, a substrate-to-electrode distance from 10 mm to 50 mm and a substrate temperature from 200° C. to 600° C.

9. A photoconductive thin film formed on a substrate and containing at least hydrogen and crystal grains of silicon, wherein the photoconductive thin film has an Urbach energy Eu of 60 meV or less, as measured by a constant photocurrent method, a hydrogen content C1 atom % ascribable to Si—H bonds, and a hydrogen content C2 atom % ascribable to Si—H$_2$ bonds such that C1/C2≧0.8 and 3≦C1+C2≦8.

10. The photoconductive thin film according to claim 9, wherein the Urbach energy Eu is from 0.9 eV to 1.1 eV, in the vicinity of 1.0 eV of photon energy.

11. The photoconductive thin film according to claim 9, wherein the crystal grains of silicon are columnar in shape, and each of the crystal grains of silicon has an angle not larger than 8° which is formed by the longer direction of each of the crystal grains and the normal direction of a surface of the substrate.

12. The photoconductive thin film according to claim 9, wherein the crystal grains of silicon have an average grain diameter from 20 nm to 200 nm, as calculated from the (220)-peak of silicon among x-ray diffraction peaks of the photoconductive thin film.

13. The photoconductive thin film according to claim 9, further containing amorphous silicon, wherein a ratio R of the volume of the crystal grains of silicon to the volume of the photoconductive thin film is $R \geq 0.5$.

14. The photoconductive thin film according to claim 9, wherein the hydrogen content C1 ascribable to the Si—H bonds is from 2 atom % to 6 atom %.

15. The photoconductive thin film according to claim 9, which is formed by plasma CVD using electromagnetic waves with a frequency from 50 MHz to 900 MHz, a silicon-containing gas and hydrogen gas, a pressure from 10 mTorr to 500 mTorr, a substrate-to-electrode distance from 10 mm to 50 mm and a substrate temperature from 200° C. to 600° C.

16. A photovoltaic device comprising a substrate and superposed successively thereon at least a back reflective layer, a photovoltaic p-i-n junction layer and a transparent conductive layer,
wherein an i-type layer constituting the p-i-n junction layer comprises a photoconductive thin film containing at least hydrogen and columnar crystal grains of silicon, and the photoconductive thin film has an Urbach energy Eu of 60 meV or less, as measured by a constant photocurrent method.

17. The photovoltaic device according to claim 16, wherein the Urbach energy Eu is from 0.9 eV to 1.1 eV, in the vicinity of 1.0 eV of photon energy.

18. The photovoltaic device according to claim 16, wherein a hydrogen content C1 atom % ascribable to Si—H bonds and a hydrogen content C2 atom % ascribable to Si—H$_2$ bonds in the photoconductive thin film are such that $C1/C2 \geq 0.8$ and $3 \leq C1+C2 \leq 8$.

19. The photovoltaic device according to claim 18, wherein the hydrogen content C1 ascribable to the Si—H bonds is from 2 atom % to 6 atom %.

20. The photovoltaic device according to claim 16, wherein each of the columnar crystal grains has an angle not larger than 8° which is formed by the longer direction of each of the columnar crystal grains and the normal direction of a surface of the substrate.

21. The photovoltaic device according to claim 16, wherein the columnar crystal grains of silicon have an average grain diameter from 20 nm to 200 nm, as calculated from the (220)-peak of silicon among x-ray diffraction peaks of the photoconductive thin film.

22. The photovoltaic device according to claim 16, wherein the photoconductive thin film further contains amorphous silicon, wherein a ratio R of the volume of the columnar crystal grains of silicon to the volume of the photoconductive thin film is $R \geq 0.5$.

23. The photovoltaic device according to claim 16, wherein the photoconductive thin film is formed by plasma CVD using electromagnetic waves with a frequency from 50 MHz to 900 MHz, a silicon-containing gas and hydrogen gas, a pressure from 10 mTorr to 500 mTorr, a substrate-to-electrode distance from 10 mm to 50 mm and a substrate temperature from 200° C. to 600° C.

24. The photovoltaic device according to claim 16, wherein the i-type layer has a thickness from 0.5 µm to 3 µm.

25. The photovoltaic device according to claim 16, wherein a high-doped layer underlying the i-type layer constituting the p-i-n junction layer is a non-single-crystal silicon thin film containing hydrogen and crystal grains of silicon.

26. The photovoltaic device according to claim 16, wherein an additional p-i-n junction layer A is provided between the p-i-n junction layer and the transparent conductive layer, and an i-type layer A constituting the p-i-n junction layer A is constituted of an amorphous silicon thin film containing hydrogen or an amorphous silicon carbide thin film containing hydrogen.

27. The photovoltaic device according to claim 26, wherein the i-type layer A has a thickness from 0.1 µm to 0.4 µm.

28. The photovoltaic device according to claim 16, wherein the back reflective layer is constituted chiefly of an element comprising silver, copper, copper-magnesium or aluminum.

29. The photovoltaic device according to claim 16, wherein the transparent conductive layer comprises ITO formed by sputtering.

30. The photovoltaic device according to claim 16, which further comprises, between the p-i-n junction layer and the back reflective layer, a back transparent conductive layer formed of ZnO or $SnO_2$.

31. The photovoltaic device according to claim 30, wherein the back transparent conductive layer has a textured structure having a surface roughness Ra from 0.1 µm to 5 µm.

32. The photovoltaic device according to claim 16, wherein at least one layer of the transparent conductive layer and the back reflective layer has a textured structure having a surface roughness Ra from 0.1 µm to 5 µm.

33. A photovoltaic device comprising a substrate and superposed successively thereon at least a back reflective layer, a photovoltaic p-i-n junction layer and a transparent conductive layer,
wherein an i-type layer constituting the p-i-n junction layer comprises a photoconductive thin film containing at least hydrogen and crystal grains of silicon, the photoconductive thin film has an Urbach energy Eu of 60 meV or less, as measured by a constant photocurrent method, and a hydrogen content C1 atom % ascribable to Si—H bonds and a hydrogen content C2 atom % ascribable to Si—H$_2$ bonds in the photoconductive thin film are such that $C1/C2 \geq 0.8$ and $3 \leq C1+C2 \leq 8$.

34. The photovoltaic device according to claim 33, wherein the Urbach energy Eu is from 0.9 eV to 1.1 eV, in the vicinity of 1.0 eV of photon energy.

35. The photovoltaic device according to claim 33, wherein the crystal grains of silicon are columnar in shape, and each of the crystal grains has an angle not larger than 8° which is formed by the longer direction of each of the crystal grains and the normal direction of a surface of the substrate.

36. The photovoltaic device according to claim 33, wherein the crystal grains of silicon have an average grain diameter from 20 nm to 200 nm, as calculated from the (220)-peak of silicon among x-ray diffraction peaks of the photoconductive thin film.

37. The photovoltaic device according to claim 33, wherein the photoconductive thin film further contains amorphous silicon, wherein a ratio R of the volume of the crystal grains of silicon to the volume of the photoconductive thin film is $R \geq 0.5$.

38. The photovoltaic device according to claim 33, wherein the hydrogen content C1 ascribable to the Si—H bonds is from 2 atom % to 6 atom %.

39. The photovoltaic device according to claim 33, wherein the photoconductive thin film is formed by plasma CVD using electromagnetic waves with a frequency from 50 MHz to 900 MHz, a silicon-containing gas and hydrogen gas, a pressure from 10 mTorr to 500 mTorr, a substrate-to-electrode distance from 10 mm to 50 mm and a substrate temperature from 200° C. to 600° C.

40. The photovoltaic device according to claim 33, wherein the i-type layer has a thickness from 0.5 $\mu$m to 3 $\mu$m.

41. The photovoltaic device according to claim 33, wherein a high-doped layer underlying the i-type layer constituting the p-i-n junction layer is a non-single-crystal silicon thin film containing hydrogen and crystal grains of silicon.

42. The photovoltaic device according to claim 33, wherein an additional p-i-n junction layer A is provided between the p-i-n junction layer and the transparent conductive layer, and an i-type layer A constituting the p-i-n junction layer A is constituted of an amorphous silicon thin film containing hydrogen or an amorphous silicon carbide thin film containing hydrogen.

43. The photovoltaic device according to claim 42, wherein the i-type layer A has a thickness from 0.1 $\mu$m to 0.4 $\mu$m.

44. The photovoltaic device according to claim 33, wherein the back reflective layer is constituted chiefly of an element comprising silver, copper, copper-magnesium or aluminum.

45. The photovoltaic device according to claim 33, wherein the transparent conductive layer comprises ITO formed by sputtering.

46. The photovoltaic device according to claim 33, which further comprises, between the p-i-n junction layer and the back reflective layer, a back transparent conductive layer formed of ZnO or $SnO_2$.

47. The photovoltaic device according to claim 46, wherein the back transparent conductive layer has a textured structure having a surface roughness Ra from 0.1 $\mu$m to 5 $\mu$m.

48. The photovoltaic device according to claim 33, wherein at least one layer of the transparent conductive layer and the back reflective layer has a textured structure having a surface roughness Ra from 0.1 $\mu$m to 5 $\mu$m.

49. A photovoltaic device comprising a substrate and superposed successively thereon at least a back reflective layer, a photovoltaic $p^+$-$p^-$-$n^+$ junction layer and a transparent conductive layer,
wherein a p-type layer constituting the $p^+$-$p^-$-$n^+$ junction layer comprises a photoconductive thin film containing at least hydrogen and columnar crystal grains of silicon, and the photoconductive thin film has an Urbach energy Eu of 60 meV or less, as measured by a constant photocurrent method.

50. The photovoltaic device according to claim 49, wherein the Urbach energy Eu is from 0.9 eV to 1.1 eV, in the vicinity of 1.0 eV of photon energy.

51. The photovoltaic device according to claim 49, wherein a hydrogen content C1 atom % ascribable to Si—H bonds and a hydrogen content C2 atom % ascribable to Si—$H_2$ bonds in the photoconductive thin film are such that C1/C2$\geq$0.8 and 3$\leq$C1+C2$\leq$8 atom %.

52. The photovoltaic device according to claim 51, wherein the hydrogen content C1 ascribable to the Si—H bonds is from 2 atom % to 6 atom %.

53. The photovoltaic device according to claim 49, wherein each of the columnar crystal grains has an angle not larger than 8° which is formed by the longer direction of each of the columnar crystal grains and the normal direction of a surface of the substrate.

54. The photovoltaic device according to claim 49, wherein the columnar crystal grains have an average grain diameter from 20 nm to 200 nm, as calculated from the (220)-peak of silicon among x-ray diffraction peaks of the photoconductive thin film.

55. The photovoltaic device according to claim 49, wherein the photoconductive thin film further contains amorphous silicon, wherein a ratio R of the volume of the columnar crystal grains of silicon to the volume of the photoconductive thin film is R$\geq$0.5.

56. The photovoltaic device according to claim 49, wherein the photoconductive thin film is formed by plasma CVD using electromagnetic waves with a frequency from 50 MHz to 900 MHz, a silicon-containing gas and hydrogen gas, a pressure from 10 mTorr to 500 mTorr, a substrate-to-electrode distance from 10 mm to 50 mm and a substrate temperature from 200° C. to 600° C.

57. The photovoltaic device according to claim 49, wherein the $p^-$-type layer has a thickness from 0.5 $\mu$m to 3 $\mu$m.

58. The photovoltaic device according to claim 49, wherein a high-doped layer underlying the $p^-$-type layer constituting the $p^+$-$p^-$-$n^+$ junction layer is a non-single-crystal silicon thin film containing hydrogen and crystal grains of silicon.

59. The photovoltaic device according to claim 49, wherein an additional p-i-n junction layer A is provided between the $p^+$-$p^-$-$n^+$ junction layer and the transparent conductive layer, and an i-type layer A constituting the p-i-n junction layer A is constituted of an amorphous silicon thin film containing hydrogen or an amorphous silicon carbide thin film containing hydrogen.

60. The photovoltaic device according to claim 59, wherein the i-type layer A has a thickness from 0.1 $\mu$m to 0.4 $\mu$m.

61. The photovoltaic device according to claim 49, wherein the back reflective layer is constituted chiefly of an element comprising silver, copper, copper-magnesium or aluminum.

62. The photovoltaic device according to claim 49, wherein the transparent conductive layer comprises ITO formed by sputtering.

63. The photovoltaic device according to claim 49, which further comprises, between the $p^+$-$p^-$-$n^+$ junction layer and the back reflective layer, a back transparent conductive layer formed of ZnO or $SnO_2$.

64. The photovoltaic device according to claim 63, wherein the back transparent conductive layer has a textured structure having a surface roughness Ra from 0.1 $\mu$m to 5 $\mu$m.

65. The photovoltaic device according to claim 49, wherein at least one layer of the transparent conductive layer and the back reflective layer has a textured structure having a surface roughness Ra from 0.1 $\mu$m to 5 $\mu$m.

66. A photovoltaic device comprising a substrate and superposed successively thereon at least a back reflective layer, a photovoltaic $p^+$-$p^-$-$n^+$ junction layer and a transparent conductive layer,
wherein a $p^-$-type layer constituting the $p^+$-$p^-$-$n^+$ junction layer comprises a photoconductive thin film containing at least hydrogen and crystal grains of silicon, the photoconductive thin film has an Urbach energy Eu of 60 meV or less, as measured by a constant photocurrent method, and a hydrogen content C1 atom % ascribable to Si—H bonds and a hydrogen content C2 atom % ascribable to Si—$H_2$ bonds in the photoconductive thin film are such that C1/C2$\geq$0.8 and 3$\leq$C1+C2$\leq$8 atom %.

67. The photovoltaic device according to claim 66, wherein the Urbach energy Eu is from 0.9 eV to 1.1 eV, in the vicinity of 1.0 eV of photon energy.

68. The photovoltaic device according to claim 66, wherein the crystal grains of silicon are columnar in shape, and each of the crystal grains of silicon has an angle not larger than 8° which is formed by the longer direction of each of the crystal grains and the normal direction of a surface of the substrate.

69. The photovoltaic device according to claim 66, wherein the crystal grains of silicon have an average grain diameter from 20 nm to 200 nm, as calculated from the (220)-peak of silicon among x-ray diffraction peaks of the photoconductive thin film.

70. The photovoltaic device according to claim 66, wherein the photoconductive thin film further contains amorphous silicon, wherein a ratio R of the volume of the crystal grains of silicon to the volume of the photoconductive thin film is $R \geq 0.5$.

71. The photovoltaic device according to claim 66, wherein the hydrogen content C1 ascribable to the Si—H bonds is from 2 atom % to 6 atom %.

72. The photovoltaic device according to claim 66, wherein the photoconductive thin film is formed by plasma CVD using electromagnetic waves with a frequency from 50 MHz to 900 MHz, a silicon-containing gas and hydrogen gas, a pressure from 10 mTorr to 500 mTorr, a substrate-to-electrode distance from 10 mm to 50 mm and a substrate temperature from 200° C. to 600° C.

73. The photovoltaic device according to claim 66, wherein the p$^-$-type layer has a thickness from 0.5 μm to 3 μm.

74. The photovoltaic device according to claim 66, wherein a high-doped layer underlying the p$^-$-type layer constituting the p$^+$-p$^-$-n$^+$ junction layer is a non-single-crystal silicon thin film containing hydrogen and crystal grains of silicon.

75. The photovoltaic device according to claim 66, wherein an additional p-i-n junction layer A is provided between the p$^+$-p$^-$-n$^+$ junction layer and the transparent conductive layer, and an i-type layer A constituting the p-i-n junction layer A is constituted of an amorphous silicon thin film containing hydrogen or an amorphous silicon carbide thin film containing hydrogen.

76. The photovoltaic device according to claim 75, wherein the i-type layer A has a thickness from 0.1 μm to 0.4 μm.

77. The photovoltaic device according to claim 66, wherein the back reflective layer is constituted chiefly of an element comprising silver, copper, copper-magnesium or aluminum.

78. The photovoltaic device according to claim 66, wherein the transparent conductive layer comprises ITO formed by sputtering.

79. The photovoltaic device according to claim 66, which further comprises, between the p$^+$-p$^-$-n$^+$ junction layer and the back reflective layer, a back transparent conductive layer formed of ZnO or SnO$_2$.

80. The photovoltaic device according to claim 79, wherein the back transparent conductive layer has a textured structure having a surface roughness Ra from 0.1 μm to 5 μm.

81. The photovoltaic device according to claim 66, wherein at least one layer of the transparent conductive layer and the back reflective layer has a textured structure having a surface roughness Ra from 0.1 μm to 5 μm.

82. A photovoltaic device comprising a substrate and superposed successively thereon at least a back reflective layer, a photovoltaic p$^+$-p$^-$-n$^+$ junction layer and a transparent conductive layer, wherein an n$^-$-type layer constituting the p$^+$-p$^-$-n$^+$ junction layer comprises a photoconductive thin film containing at least hydrogen and columnar crystal grains of silicon, and the photoconductive thin film has an Urbach energy Eu of 60 meV or less, as measured by a constant photocurrent method.

83. The photovoltaic device according to claim 82, wherein the Urbach energy Eu is from 0.9 eV to 1.1 eV, in the vicinity of 1.0 eV of photon energy.

84. The photovoltaic device according to claim 82, wherein a hydrogen content C1 atom % ascribable to Si—H bonds and a hydrogen content C2 atom % ascribable to Si—H$_2$ bonds in the photoconductive thin film are such that C1/C2$\geq$0.8 and 3$\leq$C1+C2$\leq$8 atom %.

85. The photovoltaic device according to claim 84, wherein the hydrogen content C1 ascribable to the Si—H bonds is from 2 atom % to 6 atom %.

86. The photovoltaic device according to claim 82, wherein each of the columnar crystal grains has an angle not larger than 8° which is formed by the longer direction of each of the columnar crystal grains and the normal direction of a surface of the substrate.

87. The photovoltaic device according to claim 82, wherein the columnar crystal grains of silicon have an average grain diameter from 20 nm to 200 nm, as calculated from the (220)-peak of silicon among x-ray diffraction peaks of the photoconductive thin film.

88. The photovoltaic device according to claim 82, wherein the photoconductive thin film further contains amorphous silicon, wherein a ratio R of the volume of the columnar crystal grains of silicon to the volume of the photoconductive thin film is $R \geq 0.5$.

89. The photovoltaic device according to claim 82, wherein the photoconductive thin film is formed by plasma CVD using electromagnetic waves with a frequency from 50 MHz to 900 MHz, a silicon-containing gas and hydrogen gas, a pressure from 10 mTorr to 500 mTorr, a substrate-to-electrode distance from 10 mm to 50 mm and a substrate temperature from 200° C. to 600° C.

90. The photovoltaic device according to claim 82, wherein the n$^-$-type layer has a thickness from 0.5 μm to 3 μm.

91. The photovoltaic device according to claim 82, wherein a high-doped layer underlying the n$^-$-type layer constituting the p$^+$-p$^-$-n$^+$ junction layer is a non-single-crystal silicon thin film containing hydrogen and crystal grains of silicon.

92. The photovoltaic device according to claim 82, wherein an additional p-i-n junction layer A is provided between the p$^+$-p$^-$-n$^+$ junction layer and the transparent conductive layer, and an i-type layer A constituting the p-i-n junction layer A is constituted of an amorphous silicon thin film containing hydrogen or an amorphous silicon carbide thin film containing hydrogen.

93. The photovoltaic device according to claim 92, wherein the i-type layer A has a thickness from 0.1 μm to 0.4 μm.

94. The photovoltaic device according to claim 82, wherein the back reflective layer is constituted chiefly of an element comprising silver, copper, copper-magnesium or aluminum.

95. The photovoltaic device according to claim 82, wherein the transparent conductive layer comprises ITO formed by sputtering.

96. The photovoltaic device according to claim 82, which further comprises, between the p$^+$-p$^-$-n$^+$ junction layer and the back reflective layer, a back transparent conductive layer formed of ZnO or SnO$_2$.

97. The photovoltaic device according to claim 96, wherein the back transparent conductive layer has a textured structure having a surface roughness Ra from 0.1 µm to 5 µm.

98. The photovoltaic device according to claim 82, wherein at least one layer of the transparent conductive layer and the back reflective layer has a textured structure having a surface roughness Ra from 0.1 µm to 5 µm.

99. A photovoltaic device comprising a substrate and superposed successively thereon at least a back reflective layer, a photovoltaic $p^+$-$p^-$-$n^+$ junction layer and a transparent conductive layer, wherein an $n^-$-type layer constituting the $p^+$-$p^-$-$n^+$ junction layer comprises a photoconductive thin film containing at least hydrogen and crystal grains of silicon, the photoconductive thin film has an Urbach energy Eu of 60 meV or less, as measured by a constant photocurrent method, and a hydrogen content C1 atom % ascribable to Si—H bonds and a hydrogen content C2 atom % ascribable to Si—$H_2$ bonds in the photoconductive thin film are such that $C1/C2 \geqq 0.8$ and $3 \leqq C1+C2 \leqq 8$ atom %.

100. The photovoltaic device according to claim 99, wherein the Urbach energy Eu is from 0.9 eV to 1.1 eV, in the vicinity of 1.0 eV of photon energy.

101. The photovoltaic device according to claim 99, wherein the crystal grains of silicon are columnar in shape, and each of the crystal grains of silicon has an angle not larger than 8° which is formed by the longer direction of each of the crystal grains and the normal direction of a surface of the substrate.

102. The photovoltaic device according to claim 99, wherein the crystal grains of silicon have an average grain diameter from 20 nm to 200 nm, as calculated from the (220)-peak of silicon among x-ray diffraction peaks of the photoconductive thin film.

103. The photovoltaic device according to claim 99, wherein the photoconductive thin film further contains amorphous silicon, wherein a ratio R of the volume of the crystal grains of silicon to the volume of the photoconductive thin film is $R \geqq 0.5$.

104. The photovoltaic device according to claim 99, wherein the hydrogen content C1 ascribable to the Si—H bonds is from 2 atom % to 6 atom %.

105. The photovoltaic device according to claim 99, wherein the photoconductive thin film is formed by plasma CVD using electromagnetic waves with a frequency from 50 MHz to 900 MHz, a silicon-containing gas and hydrogen gas, a pressure from 10 mTorr to 500 mTorr, a substrate-to-electrode distance from 10 mm to 50 mm and a substrate temperature from 200° C. to 600° C.

106. The photovoltaic device according to claim 99, wherein the $n^-$-type layer has a thickness from 0.5 µm to 3 µm.

107. The photovoltaic device according to claim 99, wherein a high-doped layer underlying the $n^-$-type layer constituting the $p^+$-$p^-$-$n^+$ junction layer is a non-single-crystal silicon thin film containing hydrogen and crystal grains of silicon.

108. The photovoltaic device according to claim 99, wherein an additional p-i-n junction layer A is provided between the $p^+$-$p^-$-$n^+$ junction layer and the transparent conductive layer, and an i-type layer A constituting the p-i-n junction layer A is constituted of an amorphous silicon thin film containing hydrogen or an amorphous silicon carbide thin film containing hydrogen.

109. The photovoltaic device according to claim 108, wherein the i-type layer A has a thickness from 0.1 µm to 0.4 µm.

110. The photovoltaic device according to claim 99, wherein the back reflective layer is constituted chiefly of an element comprising silver, copper, copper-magnesium or aluminum.

111. The photovoltaic device according to claim 99, wherein the transparent conductive layer comprises ITO formed by sputtering.

112. The photovoltaic device according to claim 99, which further comprises, between the $p^+$-$p^-$-$n^+$ junction layer and the back reflective layer, a back transparent conductive layer formed of ZnO or $SnO_2$.

113. The photovoltaic device according to claim 112, wherein the back transparent conductive layer has a textured structure having a surface roughness Ra from 0.1 µm to 5 µm.

114. The photovoltaic device according to claim 99, wherein at least one layer of the transparent conductive layer and the back reflective layer has a textured structure having a surface roughness Ra from 0.1 µm to 5 µm.

* * * * *

UNITED STATES PATENT AND TRADEMARK OFFICE
CERTIFICATE OF CORRECTION

| | |
|---|---|
| PATENT NO. | : 6,215,061 B1 |
| APPLICATION NO. | : 09/250246 |
| DATED | : April 10, 2001 |
| INVENTOR(S) | : Toshimitsu Kariya |

It is certified that error appears in the above-identified patent and that said Letters Patent is hereby corrected as shown below:

COLUMN 31
Line 44, "p-type" should read --$p^-$-type--.

COLUMN 34
Line 48, "wherein-an" should read --wherein an--.

Signed and Sealed this

Tenth Day of July, 2007

JON W. DUDAS
*Director of the United States Patent and Trademark Office*